(12) United States Patent
Hayashi et al.

(10) Patent No.: US 9,166,056 B2
(45) Date of Patent: Oct. 20, 2015

(54) THIN-FILM SEMICONDUCTOR DEVICE AND METHOD OF MANUFACTURING THE SAME

(71) Applicants: PANASONIC CORPORATION, Osaka (JP); PANASONIC LIQUID CRYSTAL DISPLAY CO., LTD., Hyogo (JP)

(72) Inventors: Hiroshi Hayashi, Hyogo (JP); Takahiro Kawashima, Osaka (JP); Genshiro Kawachi, Chiba (JP)

(73) Assignees: PANASONIC CORPORATION, Osaka (JP); PANASONIC LIQUID DISPLAY CO., LTD., Hyogo (JP)

( * ) Notice: Subject to any disclaimer, the term of this patent is extended or adjusted under 35 U.S.C. 154(b) by 185 days.

(21) Appl. No.: 13/940,643

(22) Filed: Jul. 12, 2013

(65) Prior Publication Data
US 2013/0299837 A1    Nov. 14, 2013

Related U.S. Application Data

(63) Continuation of application No. PCT/JP2011/006407, filed on Nov. 17, 2011.

(51) Int. Cl.
| | | |
|---|---|---|
| *H01L 29/10* | (2006.01) | |
| *H01L 29/76* | (2006.01) | |
| *H01L 31/036* | (2006.01) | |
| *H01L 31/112* | (2006.01) | |
| *H01L 29/786* | (2006.01) | |

(Continued)

(52) U.S. Cl.
CPC .... *H01L 29/78678* (2013.01); *H01L 29/41733* (2013.01); *H01L 29/66765* (2013.01); *H01L 29/78636* (2013.01)

(58) Field of Classification Search
CPC .................... H01L 29/7869; H01L 29/66969; H01L 29/66742; H01L 27/1225
See application file for complete search history.

(56) References Cited

U.S. PATENT DOCUMENTS

| 7,385,224 B2 * | 6/2008 | Ishii et al. ..................... 257/72 |
| 8,330,166 B2 | 12/2012 | Hayashi et al. |
| 8,487,308 B2 | 7/2013 | Ikeda et al. |

(Continued)

FOREIGN PATENT DOCUMENTS

| JP | 61-187272 | 8/1986 |
| JP | 01-219825 | 9/1989 |

(Continued)

OTHER PUBLICATIONS

International Search Report (ISR) and Written Opinion (WO) in International Application No. PCT/JP2011/006407, dated Jan. 17, 2012.

*Primary Examiner* — Zandra Smith
*Assistant Examiner* — John M Parker
(74) *Attorney, Agent, or Firm* — Greenblum & Bernstein P.L.C.

(57) ABSTRACT

In a thin-film semiconductor device, a semiconductor layer has a bandgap energy of 1.6 eV or less, an insulating layer formed above the semiconductor layer includes: a first insulating layer region placed outside of a first contact opening and above one end of a gate electrode; a second insulating layer region placed outside of a second contact opening and above the other end of the gate electrode which opposes the one end; and a third insulating layer region being rectangular and placed between the first contact opening and the second contact opening.

5 Claims, 27 Drawing Sheets

(51) Int. Cl.
*H01L 29/66* (2006.01)
*H01L 29/417* (2006.01)

(56) References Cited

U.S. PATENT DOCUMENTS

| | | | |
|---|---|---|---|
| 2003/0201482 A1* | 10/2003 | Shimoida et al. | 257/302 |
| 2010/0258805 A1 | 10/2010 | Ikeda et al. | |
| 2010/0301328 A1* | 12/2010 | Yamazaki et al. | 257/43 |
| 2011/0031491 A1* | 2/2011 | Yamazaki et al. | 257/43 |
| 2013/0037806 A1 | 2/2013 | Hayashi et al. | |
| 2013/0105797 A1 | 5/2013 | Hayashi et al. | |
| 2013/0119391 A1 | 5/2013 | Kanegae et al. | |
| 2013/0126869 A1 | 5/2013 | Kanegae et al. | |

FOREIGN PATENT DOCUMENTS

| | | |
|---|---|---|
| JP | 04-348041 | 12/1992 |
| JP | 04-360575 | 12/1992 |
| JP | 2010-263182 | 11/2010 |
| JP | 2011-009719 | 1/2011 |

* cited by examiner

THIN-FILM SEMICONDUCTOR DEVICE AND METHOD OF MANUFACTURING THE SAME

CROSS REFERENCE TO RELATED APPLICATION

This is a continuation application of PCT Patent Application No. PCT/JP2011/006407 filed on Nov. 17, 2011, designating the United States of America. The entire disclosure of the above-identified application, including the specification, drawings and claims are incorporated herein by reference in its entirety.

FIELD

One or more exemplary embodiments disclosed herein relate generally to a thin-film semiconductor device used for a display apparatus such as an organic electroluminescence (EL) display, and a method of manufacturing the same.

BACKGROUND

Recently, organic electroluminescence (EL) displays using organic electroluminescence have been attracting attention as one of next-generation flat panel displays to replace the liquid crystal display. In an active-matrix display apparatus such as an organic EL display, a thin-film semiconductor device referred to as a thin-film transistor (TFT) is used.

A bottom-gate thin-film semiconductor device in which a gate electrode is formed closer to a substrate than to a semiconductor layer is generally used as the thin-film semiconductor device (see Patent Literatures (PTLs) 1 to 3). FIG. 13 is a cross-sectional view showing a structure of a conventional bottom-gate thin-film semiconductor device. In a thin-film semiconductor device 500 shown in the figure, a gate electrode 52 is formed above a substrate 51, and a gate insulating film 53 is further formed above the gate electrode 52 and above the substrate 51 extending beyond the both ends of the gate electrode 52. A semiconductor layer 54 having a channel region is formed above the gate insulating film 53. The semiconductor layer 54 is a polycrystalline silicon thin film formed by crystallizing noncrystalline silicon (amorphous silicon). A source electrode 57S and a drain electrode 57D are formed above the semiconductor layer 54, with a pair of contact layers 56 therebetween. In addition, a channel protection layer 55 servicing as a channel etching stopper layer is formed above the channel region of the semiconductor layer 54.

In a technique of manufacturing the thin-film semiconductor device 500, when the gate insulating film 53 is formed by plasma CVD
(Chemical Vapor Deposition) or the like, a step portion 58 is formed in each of parts of the gate insulating film 53 corresponding to the both ends of the gate electrode 52, due to a film thickness of the gate electrode 52. FIG. 14 is an electron microscopic picture showing a cross-section of the step portion of the gate insulating film in the conventional thin-film semiconductor device. As shown in FIG. 14, a flat portion 59 of the gate insulating film 53 has a film thickness $t_1$ of approximately 110 nm, the gate electrode has a film thickness $t_2$ of approximately 50 nm, and a film thickness ratio R is $R=t_1/t_2=110$ nm/50 nm=2.2. The step portion 58 of the gate insulating film 53 has a film thickness $t_3$ of approximately 70 nm, and the film thickness $t_3$ is less than the film thickness $t_1$ of the flat portion 59 of the gate insulating film 53.

CITATION LIST

Patent Literature

[PTL 1] Japanese Unexamined Patent Application Publication No. 4-348041
[PTL 2] Japanese Unexamined Patent Application Publication No. 4-360575
[PTL 3] Japanese Unexamined Patent Application Publication No. 2011-9719

SUMMARY

Technical Problem

In the structure of the conventional thin-film semiconductor device 500, the film thickness $t_3$ of the step portion 58 of the gate insulating film 53 is reduced, and thus electric fields concentrate in the part of the semiconductor layer 54 corresponding to the step portion 58 of the gate insulating film 53. Consequently, at a time of OFF operation of the thin-film semiconductor device 500, leak current occurs in the part of the semiconductor layer 54 due to tunnel current. For this reason, the conventional thin-film semiconductor device 500 has faced a problem of increasing OFF characteristics by reducing the leak current at the time of the OFF operation.

One non-limiting and exemplary embodiment provides a thin-film semiconductor device that makes it possible to reduce leak current at a time of OFF operation, and a method of manufacturing the same.

Solution to Problem

In one general aspect, the techniques disclosed here feature a thin-film semiconductor device including: a substrate; a substrate; a gate electrode formed above the substrate; a gate insulating film formed above the gate electrode and above the substrate extending beyond both ends of the gate electrode; a semiconductor layer formed above the gate insulating film, and having a channel region and a bandgap energy of 1.6 eV or less; an insulating layer formed above the semiconductor layer, having a first contact opening and a second contact opening that are placed apart from each other, and including a first insulating layer region, a second insulating layer region, and a third insulating layer region that is rectangular, the first insulating layer region being placed outside of the first contact opening and above one end of the gate electrode, the second insulating layer region being placed outside of the second contact opening and above the other end of the gate electrode which opposes the one end, and the third insulating layer region being placed between the first contact opening and the second contact opening; and a source electrode and a drain electrode both formed above the insulating layer, the source electrode being electrically connected to the channel region with the first contact opening therebetween, and the drain electrode opposing the source electrode and being electrically connected to the channel region with the second contact opening therebetween, wherein each of the source electrode and the drain electrode has a size in a channel width direction greater than a size of the third insulating layer region in the channel width direction, and the third insulating layer region has corners each of which is below a corresponding one of the source electrode and the drain electrode.

Advantageous Effects

As stated above, in the thin-film semiconductor device according to one or more exemplary embodiments or features disclosed herein, the first insulating layer region is placed above the one end of the gate electrode, and the second insulating layer region is placed above the other end of the gate electrode. The first insulating layer region and the second insulating layer region block the paths of leak current, and thus parts of the semiconductor layer where electric fields concentrate, that is, parts of the semiconductor layer corresponding to the both ends of the gate electrode do not contribute to conduction of the leak current. For this reason, it is possible to reduce the possibility of the contribution of the generated tunnel current as the leak current, and to increase OFF characteristics. Moreover, even when the film thickness of the gate insulating film corresponding to the both ends of the gate electrode become less by increasing the film thickness of the gate electrode and decreasing the film thickness of a flat portion of the gate insulating film, the leak current can be reduced as above. Thus, it is possible to simultaneously achieve reduction in wiring resistance and an increase of ON current. Furthermore, each of the source electrode and the drain electrode has the size in the channel width direction greater than the size of the third insulating layer region in the channel width direction, and thus it is possible to reduce parasitic resistance between the channel region of the semiconductor layer, and the source electrode and the drain electrode.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 1 is a cross-sectional view showing a structure of a thin-film semiconductor device according to Embodiment 1.

FIG. 2 is a cross-sectional view showing enlarged part of the thin-film semiconductor device of FIG. 1.

FIG. 3A is a plan view showing an arrangement relationship between a gate electrode and an insulating layer.

FIG. 3B is a plan view showing an arrangement relationship among a gate electrode, an insulating layer, a source electrode, and a drain electrode.

FIG. 4A is a cross-sectional view showing a first step in a method of manufacturing a thin-film semiconductor device.

FIG. 4B is a cross-sectional view showing a second step in the method of manufacturing a thin-film semiconductor device.

FIG. 4C is a cross-sectional view showing a third step in the method of manufacturing a thin-film semiconductor device.

FIG. 4D is a cross-sectional view showing a fourth step in the method of manufacturing a thin-film semiconductor device.

FIG. 4E is a cross-sectional view showing a fifth step in the method of manufacturing a thin-film semiconductor device.

FIG. 4F is a cross-sectional view showing a sixth step in the method of manufacturing a thin-film semiconductor device.

FIG. 4G is a cross-sectional view showing a step of forming a contact layer in the method of manufacturing a thin-film semiconductor device.

FIG. 4H is a cross-sectional view showing a seventh step in the method of manufacturing a thin-film semiconductor device.

FIG. 4I is a cross-sectional view showing the seventh step in the method of manufacturing a thin-film semiconductor device.

FIG. 5A is a graph showing a result of simulating each of electric characteristics of a thin-film semiconductor device according to Embodiment 1 and electric characteristics of a conventional thin-film semiconductor device.

FIG. 5B is a graph showing a result of testing, using an actual device, each of the electric characteristics of the thin-film semiconductor device according to Embodiment 1 and the electric characteristics of the conventional thin-film semiconductor device.

FIG. 6 is a diagram showing a result of simulating current density distribution at a time of OFF operation in the thin-film semiconductor device according to Embodiment 1.

FIG. 7A is a graph showing a result of simulating a variation in drain current relative to the bandgap energy of a semiconductor layer.

FIG. 7B is a graph showing a result of simulating a variation in drain current relative to gate-to-source voltage.

FIG. 8A is a plan view for describing definitions of a dimension A, a dimension B, and a dimension C.

FIG. 8B is a plan view for describing definitions of a dimension A, a dimension B, and a dimension C.

FIG. 9A is a graph showing an experimental result obtained by evaluating a variation in parasitic resistance relative to a dimension C when a dimension W is 5 μm, a dimension A is 2 μm, a dimension B is 3 μm.

FIG. 9B is a graph showing an experimental result obtained by evaluating a variation in parasitic resistance relative to a dimension C when a dimension W is 50 μm, a dimension A is 2 μm, a dimension B is 3 μm.

FIG. 9C is a graph more clearly showing a variation in parasitic resistance by reducing a scale of the vertical axis in FIG. 9B.

FIG. 10A is a graph showing an experimental result obtained by evaluating a variation in parasitic resistance relative to a dimension A when a dimension W is 5 μm, a dimension B is 3 μm, a dimension C is 3 μm.

FIG. 10B is a graph showing an experimental result obtained by evaluating a variation in parasitic resistance relative to a dimension A when a dimension W is 50 μm, a dimension B is 3 μm, a dimension C is 3 μm.

FIG. 11A is a graph showing an experimental result obtained by evaluating a variation in parasitic resistance relative to a dimension B when a dimension W is 5 µm, a dimension A is 2 µm, a dimension C is 3 µm.

FIG. 11B is a graph showing an experimental result obtained by evaluating a variation in parasitic resistance relative to a dimension B when a dimension W is 50 µm, a dimension A is 2 µm, a dimension C is 3 µm.

FIG. 11C is a diagram for describing a parasitic resistance model.

FIG. 12A is a plan view showing an arrangement relationship between a gate electrode and an insulating layer in a thin-film semiconductor device according to Embodiment 2.

FIG. 12B is a plan view showing an arrangement relationship among a gate electrode, an insulating layer, a source electrode, and a drain electrode in the thin-film semiconductor device according to Embodiment 2.

FIG. 13 is a cross-sectional view showing a structure of a conventional thin-film semiconductor device.

FIG. 14 is an electron microscopic picture showing a cross-section of a step portion of a gate insulating film in the conventional thin-film semiconductor device.

FIG. 15 is a diagram showing a result of simulating current density distribution at a time of OFF operation in the conventional thin-film semiconductor device.

FIG. 16 is a diagram showing a result of simulating a band-to-band tunneling rate at a time of OFF operation in the conventional thin-film semiconductor device.

DESCRIPTION OF EMBODIMENTS

Underlying Knowledge Forming Basis of the Present Disclosure

In relation to the thin-film semiconductor device disclosed in the Background section, the inventors have found the following problem.

Figure 13:
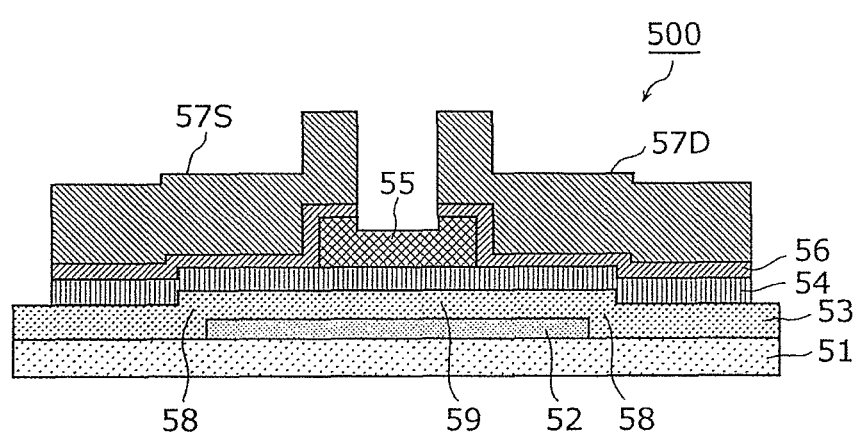
[FIG. 13]
Figure 14:
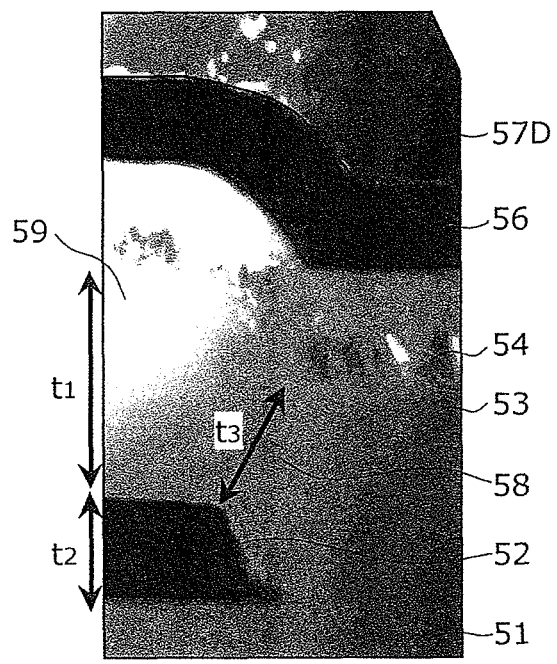
[FIG. 14]

Generally speaking, as shown in FIG. 13 and FIG. 14, to reduce wiring resistance of a thin-film semiconductor device 500, it is desirable that a gate electrode 52 should have a greater film thickness $t_2$. In addition, to increase ON current of the thin-film semiconductor device 500, it is desirable that a flat portion 59 of a gate insulating film 53 should have a less film thickness $t_1$. In other words, to simultaneously achieve the reduction in the wiring resistance and the increase of the ON current, it is necessary to separately set the film thickness $t_1$ of the flat part 59 of the gate insulating film 53 and the film thickness $t_2$ of the gate electrode 52, to cause a film thickness ratio R to be smaller.

However, when the film thickness ratio R becomes smaller, a step portion 58 of the gate insulating film 53 becomes steeper in shape, and a film thickness $t_3$ of the step portion 58 of the gate insulating film 53 is further reduced. This increases electric field intensity of a part of a semiconductor layer 54, thereby increasing magnitude of leak current to be generated.

Figure 15:
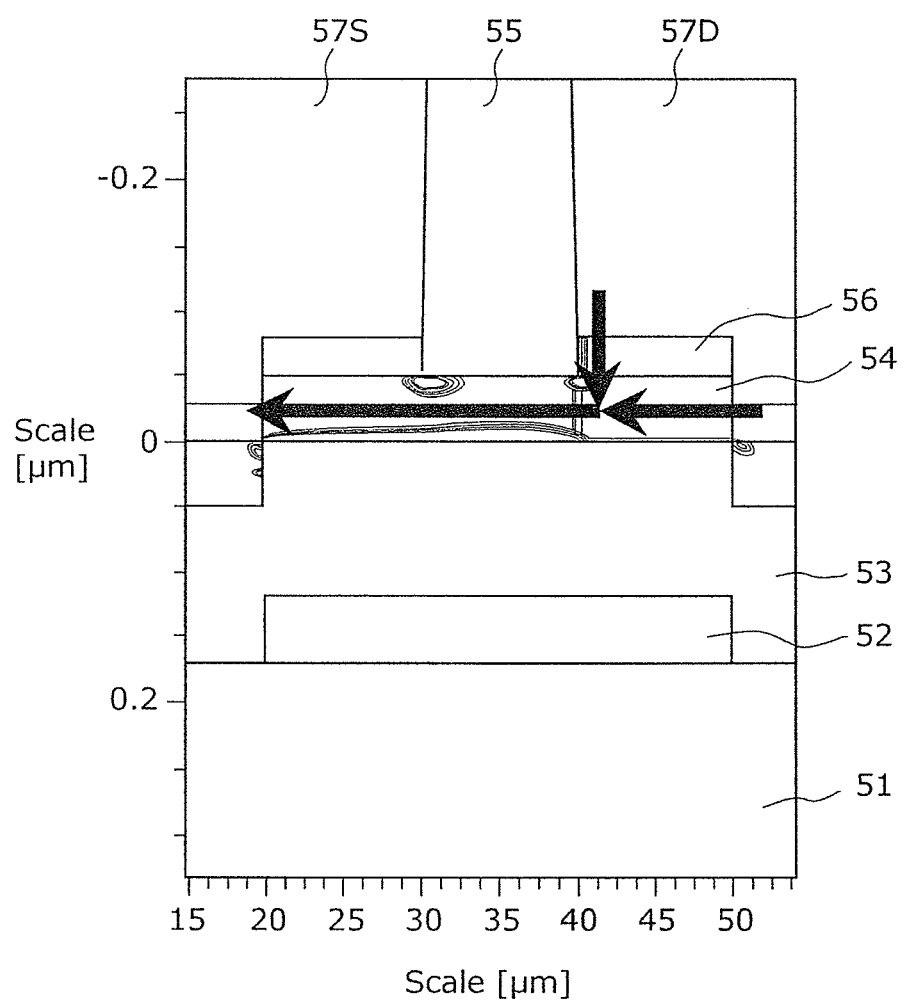
[FIG. 15]

FIG. 15 is a diagram showing a result of simulating current density distribution at a time of OFF operation in a conventional thin-film semiconductor device. In this simulation, the thin-film semiconductor device having the structure shown in FIG. 13 is used in which molybdenum tungsten (MoW) having a film thickness of 50 nm, silicon oxide (SiO) having a film thickness of 120 nm, polycrystalline silicon having a film thickness of 50 nm, silicon oxide (SiO) having a film thickness of 500 nm, noncrystalline silicon having a film thickness of 40 nm, and aluminum (Al) having a film thickness of 600 nm are used as the gate electrode 52, the gate insulating film 53, a semiconductor layer 54, a channel protection layer 55, a contact layer 56, and a source electrode 57S and a drain electrode 57D, respectively. In addition, −20 V and 5.1 V are applied as a gate-to-source voltage and a drain-to-source voltage, respectively. In FIG. 15, contour lines represent density distribution of leak current generated at the time of the OFF operation. As shown by the contour lines in FIG. 15, it is possible to understand a situation where the leak current flows through the semiconductor layer 54 at the time of the OFF operation. It is to be noted that the leak current flows in directions indicated by arrows in FIG. 15.

Figure 16:
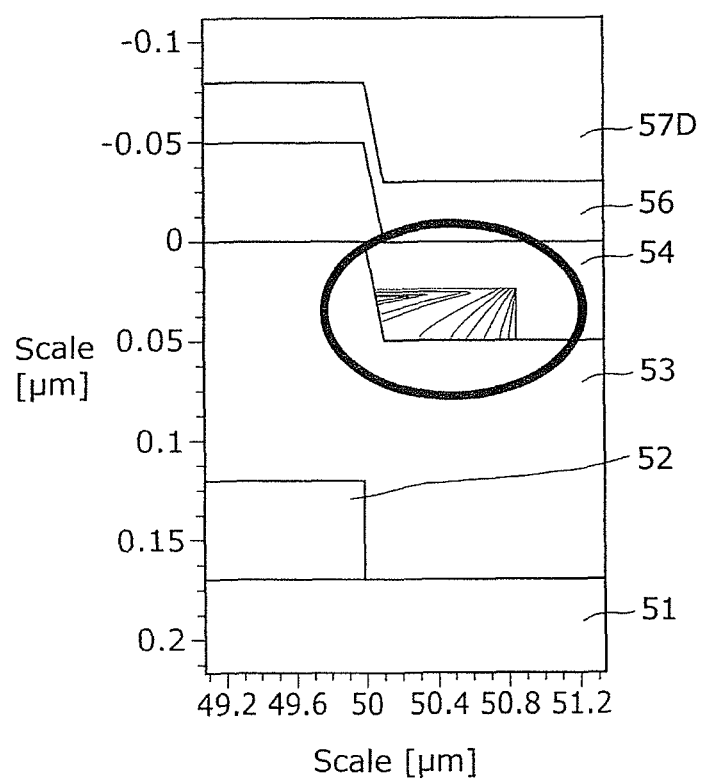
[FIG. 16]

FIG. 16 is a diagram showing a result of simulating a band-to-band tunneling rate at a time of OFF operation in the conventional thin-film semiconductor device. Simulation conditions of this simulation are substantially the same as those of the simulation in FIG. 15. In FIG. 16, contour lines represent distribution of band-to-band tunneling rates (/scm$^3$). As shown by the contour lines enclosed by a solid line in FIG. 16, it is possible to understand a situation where leak current is generated in the part of the semiconductor layer 54 corresponding to the step portion of the gate insulating film 53, at the time of the OFF operation.

As described above, in the structure of the conventional thin-film semiconductor device, a film thickness at the step portion of the gate insulating film is reduced, and thus electric fields concentrate in the part of the semiconductor layer corresponding to the step portion. As a result, there has been a problem that the leak current is generated at the time of the OFF operation due to tunnel current, which deteriorates OFF characteristics. In addition, when the film thickness ratio R becomes smaller, the film thickness at the step portion of the gate insulating film is further reduced, which increases magnitude of the leak current to be generated. Consequently, there has been a problem that it is not possible to reduce the film thickness ratio R, which makes it difficult to simultaneously achieve reduction in wiring resistance and an increase of ON current.

According to an exemplary embodiment disclosed herein, a thin-film semiconductor device including: a substrate; a gate electrode formed above the substrate; a gate insulating film formed above the gate electrode and above the substrate extending beyond both ends of the gate electrode; a semiconductor layer formed above the gate insulating film, and having a channel region and a bandgap energy of 1.6 eV or less; an insulating layer formed above the semiconductor layer, having a first contact opening and a second contact opening that are placed apart from each other, and including a first insulating layer region, a second insulating layer region, and a third insulating layer region that is rectangular, the first insulating layer region being placed outside of the first contact opening and above one end of the gate electrode, the second insulating layer region being placed outside of the second contact opening and above the other end of the gate electrode which opposes the one end, and the third insulating layer region being placed between the first contact opening and the second contact opening; and a source electrode and a drain electrode both formed above the insulating layer, the source electrode being electrically connected to the channel region with the first contact opening therebetween, and the drain electrode opposing the source electrode and being electrically connected to the channel region with the second contact opening therebetween, wherein each of the source electrode and the drain electrode has a size in a channel width direction greater than a size of the third insulating layer region in the channel width direction, and the third insulating layer region has corners each of which is below a corresponding one of the source electrode and the drain electrode.

With this, the first insulating layer region is placed above the one end of the gate electrode, and the second insulating layer region is placed above the other end of the gate electrode. The first insulating layer region and the second insulating layer region block the paths of leak current, and thus parts of the semiconductor layer where electric fields concentrate, that is, parts of the semiconductor layer corresponding to the both ends of the gate electrode do not contribute to conduction of the leak current. For this reason, it is possible to reduce the possibility of the contribution of the generated tunnel current as the leak current, and to increase the OFF characteristics. Moreover, even when the film thickness of the gate insulating film corresponding to the both ends of the gate electrode become less by increasing the film thickness of the gate electrode and decreasing the film thickness of a flat portion of the gate insulating film, the leak current can be reduced as above. Thus, it is possible to simultaneously achieve the reduction in wiring resistance and the increase of the ON current. Furthermore, each of the source electrode and the drain electrode has the size in the channel width direction greater than the size of the third insulating layer region in the channel width direction, and thus it is possible to reduce the parasitic resistance between the channel region of the semiconductor layer, and the source electrode and the drain electrode.

For example, in the thin-film semiconductor device, the third insulating layer region may serve as a channel etching stopper layer that covers the channel region.

With this, causing the third insulating layer region to serve as the channel etching stopper layer makes it possible to prevent the channel region of the semiconductor layer from being etched in an etching process in a technique of manufacturing a thin-film semiconductor device.

For example, in the thin-film semiconductor device, each end of the source electrode and the drain electrode may protrude 2 μm or more from both ends of the third insulating layer region in the channel width direction.

With this, it is possible to effectively reduce parasitic resistance between the channel region of the semiconductor layer, and the source electrode and the drain electrode. For example, in the thin-film semiconductor device, each end of the source electrode and the drain electrode may protrude 4 μm or more from both ends of the third insulating layer region in the channel width direction.

With this, it is possible to more effectively reduce the parasitic resistance between the channel region of the semiconductor layer, and the source electrode and the drain electrode.

According to another exemplary embodiment disclosed herein, a method of manufacturing a thin-film semiconductor device, the method including: preparing a substrate; forming a gate electrode above the substrate; forming a gate insulating film above the gate electrode and above the substrate extending beyond both ends of the gate electrode; forming, above the gate insulating film, a semiconductor layer having a channel region and a bandgap energy of 1.6 eV or less; forming an insulating layer above the semiconductor layer; forming, in the insulating layer, a first contact opening and a second contact opening apart from each other so that the insulating layer includes a first insulating layer region, a second insulating layer region, and a third insulating layer region that is rectangular, the first insulating layer region being placed outside of the first contact opening and above one end of the gate electrode, the second insulating layer region being placed outside of the second contact opening and above the other end of the gate electrode which opposes the one end, and the third insulating layer region being placed between the first contact opening and the second contact opening; and forming, above the insulating layer, a source electrode and a drain electrode that opposes the source electrode, the source electrode being electrically connected to the channel region with the first contact opening therebetween, and the drain electrode being electrically connected to the channel region with the second contact opening therebetween, wherein each of the source electrode and the drain electrode has a size in a channel width direction greater than a size of the third insulating layer region in the channel width direction, and the third insulating layer region has corners each of which is below a corresponding one of the source electrode and the drain electrode.

With this, in the forming of a first contact opening, the first insulating layer region that is placed above the one end of the gate electrode is formed, and the second insulating layer region that is placed above the other end of the gate electrode is formed. The first insulating layer region and the second insulating layer region block the paths of leak current, and thus parts of the semiconductor layer where electric fields concentrate, that is, parts of the semiconductor layer corresponding to the both ends of the gate electrode do not contribute to conduction of the leak current. For this reason, it is possible to reduce the possibility of the contribution of the generated tunnel current as the leak current, and to increase the OFF characteristics. Moreover, even when the film thickness of the gate insulating film corresponding to the both ends of the gate electrode become less by forming the gate electrode having an increased film thickness in the forming of a gate electrode and by forming a flat portion of the gate insulating film which has a decreased film thickness in the forming of a gate insulating film, the leak current can be reduced as above. Thus, it is possible to simultaneously achieve the reduction in wiring resistance and the increase of the ON current. Furthermore, each of the source electrode and the drain electrode has the size in the channel width direction greater than the size of the third insulating layer region in the channel width direction, and thus it is possible to reduce parasitic resistance between the channel region of the semiconductor layer, and the source electrode and the drain electrode.

(Embodiments)

Hereinafter, certain exemplary embodiments are described in greater detail with reference to the accompanying Drawings. Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements. Each of the accompanying Drawings is a schematic diagram, and is not necessarily illustrated strictly.

(Embodiment 1)

Figure 1:
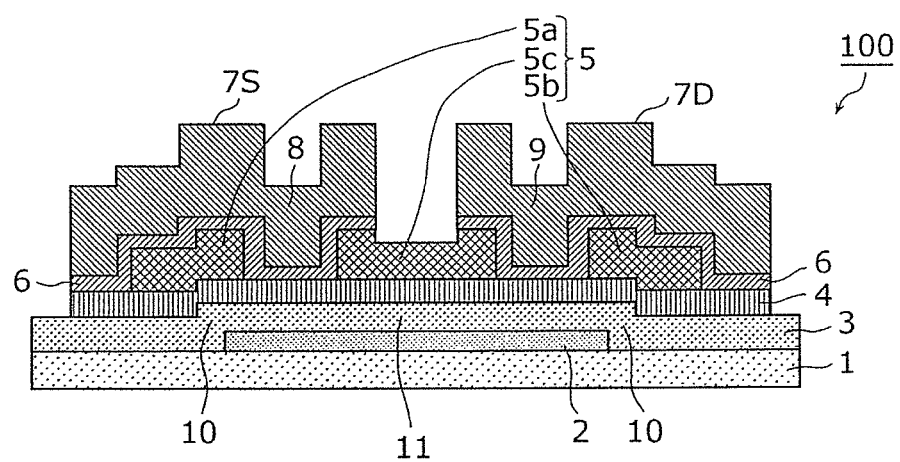
[FIG. 1]
Figure 2:
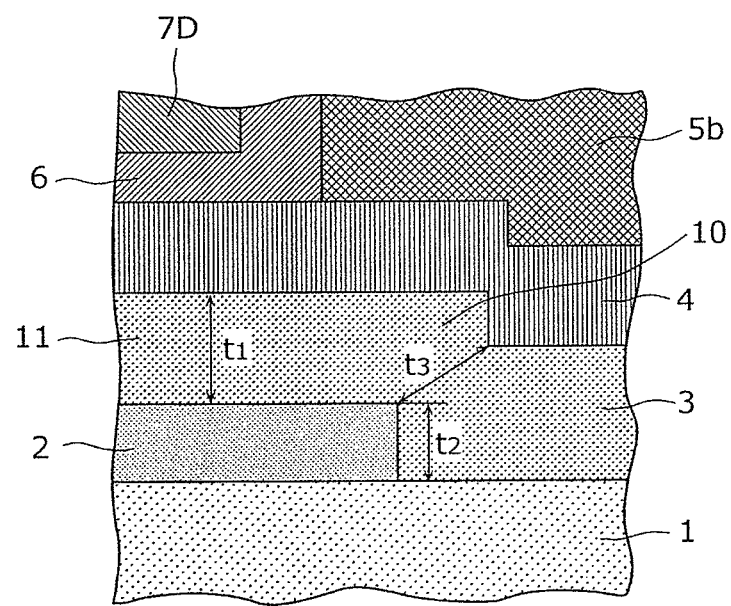
[FIG. 2]

The following describes a structure of a thin-film semiconductor device according to Embodiment 1 with reference to FIG. 1 and FIG. 2. FIG. 1 is a cross-sectional view showing a structure of a thin-film semiconductor device according to Embodiment 1. FIG. 2 is a cross-sectional view showing enlarged part of the thin-film semiconductor device of FIG. 1.

As shown in FIG. 1, a thin-film semiconductor device 100 according to this embodiment is a bottom-gate thin-film semiconductor device. The thin-film semiconductor device 100 includes a substrate 1, a gate electrode 2, a gate insulating film 3, a semiconductor layer 4, a insulating layer 5, a pair of contact layers 6, a source electrode 7S, and a drain electrode 7D. Hereinafter, each of structural elements in the thin-film semiconductor device 100 according to this embodiment will be described in detail.

The substrate 1 is a glass substrate made of a glass material such as silica glass, alkali-free glass, and high heat resistance glass. It is to be noted that an undercoat layer which includes a silicon nitride film ($SiN_x$), silicon oxide ($SiO_y$), silicon oxide nitride film ($SiO_yN_x$), or the like may be formed above the substrate 1, so as to prevent impurities such as sodium and phosphorus included in the glass substrate from invading the semiconductor layer 4. In addition, in some cases, the undercoat layer plays a role to mitigate the influence of heat on the substrate 1 in a high temperature heat process such as laser annealing.

The gate electrode 2 is formed into a predetermined shape on the substrate 1. The gate electrode 2 can be formed into a monolayer structure or a multilayer structure of a conductive material, an alloy of such materials, or the like, and can be formed of a material such as molybdenum (Mo), aluminum (Al), copper (Cu), tungsten (W), titanium (Ti), chrome (Cr), molybdenum tungsten (MoW), and the like. The gate electrode 2 has, for example, a film thickness $t_2$ of 50 nm (see FIG. 2).

The gate insulating film 3 is formed above the gate electrode 2 and above the substrate 1 extending beyond the both ends of the gate electrode 2 in a channel length direction (a horizontal direction in FIG. 1). To put it differently, the gate insulating film 3 is formed in a whole surface of the substrate 1 to cover the gate electrode 2. The gate insulating film 3 can be formed using, for instance, a single layer film of silicon oxide ($SiO_y$), silicon nitride ($SiN_x$), silicon oxide nitride film ($SiO_yN_x$), aluminum oxide ($AlO_z$), or tantalum oxide ($TaO_w$), or a stacked film thereof. A flat portion 11 of the gate insulating film 3 has a film thickness $t_1$ of approximately 110 nm, for example (see FIG. 2). In addition, as shown in FIG. 2, a step portion 10 is formed in each of parts of the gate insulating film 3 corresponding to the respective both ends of the gate electrode 2. The step portion 10 of the gate insulating film 3 has a film thickness $t_3$ less than the film thickness $t_1$, and the film thickness $t_3$ is, for instance, approximately 70 nm.

The semiconductor layer 4 is formed above the gate insulating film 3 and has a channel region. The channel region is a region in which carrier transfer is controlled by the voltage of the gate electrode 2. The semiconductor layer 4 is formed of a polycrystalline silicon thin film having a crystalline organizational structure. The polycrystalline silicon thin film is formed by, for instance, crystallizing noncrystalline silicon (amorphous silicon). The semiconductor layer 4 can have a film thickness approximately ranging from 20 nm to 100 nm, for example. As will be described, the semiconductor layer 4 has a bandgap energy of 1.6 eV or less. When the semiconductor layer 4 is formed of the polycrystalline silicon film as in this embodiment, the semiconductor layer 4 has a bandgap energy of approximately 1.1 eV.

The insulating layer 5 is formed as an organic material layer that mainly contains an organic material including silicon, oxygen, and carbon. In this embodiment, the insulating layer 5 can be formed by patterning and solidifying a photosensitive coat-type organic material.

Examples of the organic material included in the insulating layer 5 include an organic resin material, a surfactant, a solvent, and a photosensitizer. For the organic resin material that is a main component of the insulating layer 5, it is possible to use a photosensitive or non-photosensitive organic resin material that is composed of one or more from among: polyimide, acryl, polyamide, polyimideamide, resist, benzocyclobutene, and so on. For the surfactant, a surfactant including a silicon compound such as siloxane can be used. For the solvent, an organic solvent such as propyleneglycol monomethylether acetate and 1,4-dioxane can be used. In addition, for the photosensitizer, a positive-type photosensitizer such as naphthoquinone diazide can be used. It is to be noted that the photosensitizer includes not only carbon but also sulfur.

The insulating layer 5 can be formed by an application method such as spin coating using the organic material. It is to be noted that the insulating layer 5 may be formed not only by the application method but also by various methods such as dropping and spitting. For instance, by using a printing method or the like that allows formation of a predetermined pattern such as screen printing and offset printing, it is possible to selectively form an organic material having a predetermined shape. The insulating layer 5 can have a film thickness ranging from 300 nm to 1000 nm, for example. Although the insulating layer 5 includes the organic material in this embodiment, the insulating layer 5 may include an inorganic material instead of the organic material.

Figure 3A:
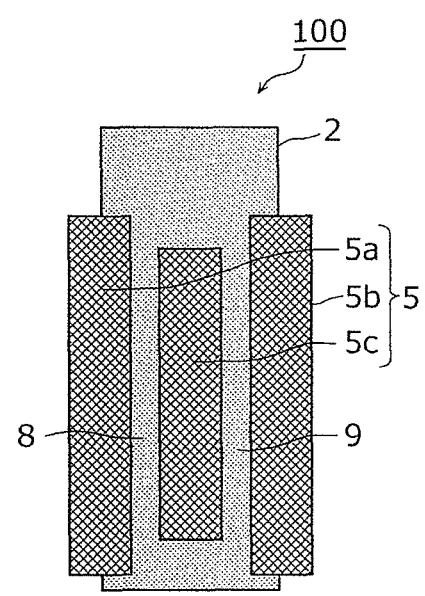
[FIG. 3A]

A first contact opening 8 and a second contact opening 9 are formed apart from each other in the insulating layer 5. The formation of the first contact opening 8 and the second contact opening 9 divides the insulating layer 5 into a first insulating layer region 5a, a second insulating layer region 5b, and a third insulating layer region 5c. FIG. 3A is a plan view showing an arrangement relationship between a gate electrode and an insulating layer. As shown in FIG. 3A, the first insulating layer region 5a is placed above one end of the gate electrode 2, that is, placed to cover from above the part of the semiconductor layer 4 corresponding to one of the step portions 10 of the gate insulating film 3 and outside of the first contact opening 8 in a channel length direction. The second insulating layer region 5b is placed above the other end of the gate electrode 2, that is, placed to cover from above the part of the semiconductor layer 4 corresponding to the other step portion 10 of the gate insulating film 3 and outside of the second contact opening 9 in the channel length direction. The third insulating layer region 5c is placed above the central part of the gate electrode 2, that is, placed to cover from above the part of the semiconductor layer 4 corresponding to the flat portion 11 of the gate insulating film 3 and between the first contact opening 8 and the second contact opening 9.

The third insulating layer region 5c serves as a channel etching stopper (CES) layer that protects the channel region of the semiconductor layer 4. As such, the third insulating layer region 5c prevents the channel region of the semiconductor layer 4 from being etched in an etching process when the pair of the contact layers 6 is formed. Stated differently, the upper surface of the third insulating layer region 5c serving as the channel etching stopper layer is etched in the etching process when the pair of the contact layers 6 is formed.

The pair of the contact layers 6 is formed above the channel region of the semiconductor layer 4, with the insulating layer 5 therebetween. In addition, the contact layers 6 are placed opposing each other at a distance. Each of the contact layers 6 is formed of a noncrystalline semiconductor film having a high concentration of impurity. Each contact layer 6 can be formed of, for instance, an N-type semiconductor film in which amorphous silicon is doped with phosphorous (P) as an impurity, and is an $n^+$-layer having a high concentration of impurity greater than or equal to $1\times10^{19}$ atm/cm$^3$. The contact layer 6 can have a film thickness of 5 nm to 100 nm, for example.

It is to be noted that the contact layer 6 can be formed of two layers including: an electric field relaxation layer (n$^-$-layer) having a low concentration of impurity as a lower layer, and a contact layer (n$^+$-layer) having a high concentration of impurity as an upper layer. Phosphorous (P) of approximately $1\times10^{17}$ atm/cm$^3$ is doped in the electric field relaxation layer having the low concentration of impurity. The two layers can be continuously formed by a CVD apparatus. Alternatively, the contact layer 6 can be formed of three layers including: the electric field relaxation layer (n$^-$-layer) having the low concentration of impurity, the contact layer (n$^+$-layer) having the high concentration of impurity, and an i layer that is a noncrystalline silicon layer in which an impurity is not doped.

The source electrode 7S is formed above the first insulating layer region 5a and the third insulating layer region 5c, with one of the contact layers 6 therebetween. The drain electrode 7D is formed above the second insulating layer region 5b and the third insulating layer region 5c, with the other of the contact layers 6 therebetween. The source electrode 7S and the drain electrode 7D are placed opposing each other at a distance.

Each of the source electrode 7S and the drain electrode 7D can be formed into a single layer structure or a multilayer structure formed of a conductive material, an alloy of such materials, or the like, and can be formed of a material such as aluminum (Al), molybdenum (Mo), tungsten (W), copper (Cu), titanium (Ti), and chrome (Cr). Each of the source electrode 7S and the drain electrode 7D can have a film thickness of approximately 100 nm to 500 nm, for instance.

Figure 3B:
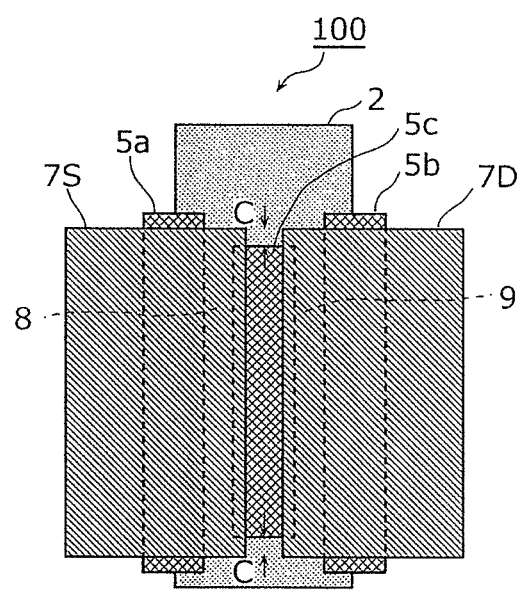
[FIG. 3B]

FIG. 3B is a plan view showing an arrangement relationship among the gate electrode 2, the insulating layer 5, the source electrode 7S, and the drain electrode 7D. As shown in FIG. 3B, the source electrode 7S and the drain electrode 7D have a size in a channel width direction (a direction orthogonal to a channel length direction, and a vertical direction in FIG. 3B) greater than the size of the third insulating layer region 5c in the channel width direction. In other words, each end of the source electrode 7S and the drain electrode 7D protrudes 4 pm or more from the both ends of the third insulating layer region 5c in the channel width direction. As will be described, it is desirable that a length C (hereinafter, referred to a "dimension C") by which each end of the source electrode 7S and the drain electrode 7D protrudes from the both ends of the third insulating layer region 5c in the channel width direction should be 2 μm or more, and it is more desirable that the length C should be 4 μm or more. It is to be noted that the entire area of the semiconductor layer 4 is completely covered with the third insulating layer region 5c, the source electrode 7S; and the drain electrode 7D.

The following describes a method of manufacturing the thin-film semiconductor device 100 according to this embodiment, with reference to FIG. 4A to FIG. 4I. Each of FIG. 4A to FIG. 4I is a cross-sectional view showing a corresponding one of processes in the method of manufacturing a thin-film semiconductor device according to Embodiment 1 of the present disclosure.

Figure 4A:
[FIG. 4A]

First, as shown in FIG. 4A, a glass substrate is prepared as the substrate 1 (the first process). It is to be noted that before the gate electrode 2 is formed in the second process to be described later, an undercoat layer including a silicon nitride film, a silicon oxide film, a silicon oxide nitride film, and so on may be formed above the substrate 1 by plasma CVD or the like.

Figure 4B:
[FIG. 4B]

Next, as shown in FIG. 4B, the gate electrode 2 is formed above the substrate 1 (the second process). In the second process, for instance, the gate electrode 2 having a predetermined shape can be formed by forming, through sputtering, a gate metal film including molybdenum tungsten (MoW) above the substrate 1 and then by patterning the gate metal film using a photolithography technique and a wet etching technique. Molybdenum tungsten (MoW) can be wet-etched using, for example, a chemical solution in which phosphoric acid (HPO$_4$), nitric acid (HNO$_3$), acetic acid (CH$_3$COOH), and water are mixed at a predetermined composition.

Figure 4C:
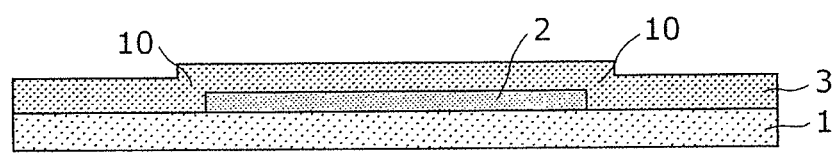
[FIG. 4C]

Next, as shown in FIG. 4C, the gate insulating film 3 is formed to cover the gate electrode 2 and the substrate 1 (the third process). In the third process, for instance, the gate insulating film 3 including silicon oxide (SiO) is formed by the plasma CVD or the like. A film including silicon oxide can be formed by, for example, introducing silane gas (SiH$_4$) and nitrous oxide gas (N$_2$O) at a predetermined concentration ratio. When the gate insulating film 3 is formed in the third process, the step portions 10 are formed in the parts of the gate insulating film 3 corresponding to the both ends of the gate electrode 2, due to the film thickness of the gate electrode 2.

Figure 4D:
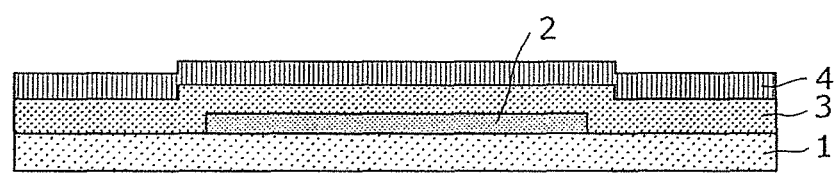
[FIG. 4D]

Next, as shown in FIG. 4D, the semiconductor layer 4 having the channel region is formed above the gate insulating film 3 (the fourth process). In the fourth process, for instance, the semiconductor layer 4 including a polycrystalline silicon thin film can be formed by forming a noncrystalline silicon thin film including amorphous silicon (noncrystalline silicon) by the plasma CVD or the like, dehydrogenation annealing the noncrystalline silicon thin film, and then further annealing and crystallizing the noncrystalline silicon thin film. In this embodiment, in the fourth process, a bandgap is adjusted by poly-crystallizing the noncrystalline silicon thin film, and the bandgap energy Eg of the semiconductor layer 4 is adjusted to 1.6 eV or less (e.g., 1.1 eV).

It is to be noted that although the noncrystalline silicon thin film is crystallized by laser annealing using an excimer laser in this embodiment, the present disclosure is not limited to this. For instance, a laser anneal technique using a pulse laser having a wavelength of approximately 370 nm to 900 nm, a laser anneal technique using a continuous wave laser having a wavelength of approximately 370 nm to 900 nm, or an anneal technique by rapid thermal processing (RTP) can be used as a method of crystallizing. In addition, the semiconductor layer 4 including a polycrystalline silicon thin film can be formed not by crystallizing the noncrystalline silicon thin film but by using a method such as direct growth by CVD.

Next, a hydrotreatment process is performed on silicon atoms contained by the semiconductor layer 4, by performing a hydrogen plasma process on the semiconductor layer 4. The hydrogen plasma process is performed by, for example, generating hydrogen plasma with high-frequency (RF) power using gas including hydrogen gas such as H$_2$, H$_2$/Argon (Ar), and irradiating the semiconductor layer 4 with the hydrogen plasma. The hydrogen plasma process hydrogen-terminates the dangling bonds (defects) of the silicon atoms to reduce the crystal defect density of the semiconductor layer 4, thereby increasing crystallinity.

Figure 4E:
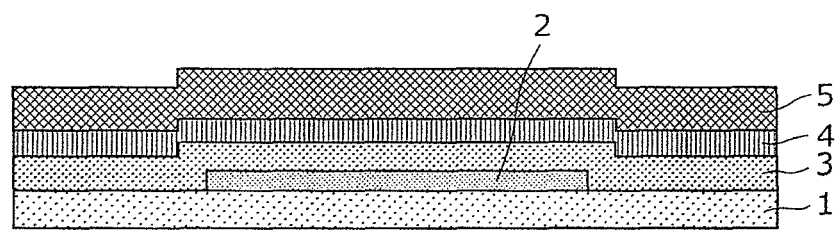
[FIG. 4E]
Figure 4F:
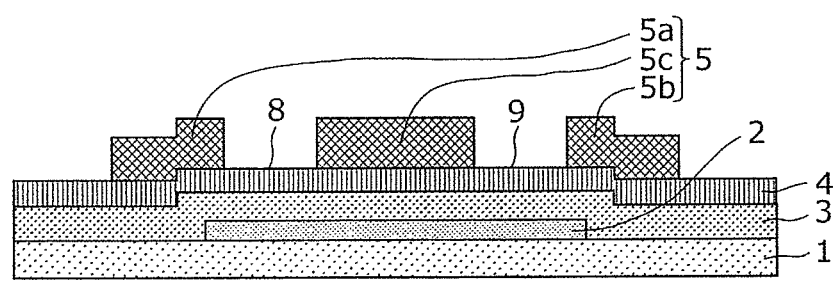
[FIG. 4F]

Next, as shown in FIG. 4E, the insulating layer 5 is formed above the semiconductor layer 4 (the fifth process). Next, as shown in FIG. 4F, the first contact opening 8 and the second contact opening 9 are formed at predetermined parts of the insulating layer 5 (the sixth process). In the fifth process and the sixth process, a film for forming an insulating film is formed in the whole surface of the semiconductor layer 4 by spin coating or slit coating after a predetermined organic material for forming the insulating layer 5 by a predetermined application method is applied on the semiconductor layer 4. The film thickness of the organic material can be regulated according to the viscosity and coating conditions (e.g., the number of rotations and the speed of a blade) of the organic material. A photosensitive coat-type organic material including silicon, oxygen, and carbon can be used as a material of the film for forming the insulating film. Subsequently, the film for forming the insulating film is prebaked for approximately 60 seconds at the temperature of approximately 110° C. This vaporizes a solvent included in the film for forming the insulating film. Subsequently, the film for forming the insulating film is patterned by exposure and development using a photomask, to form the insulating layer 5 having a predetermined shape (i.e., the first insulating layer region 5a, the second insulating layer region 5b, and the third insulating layer region 5c). Subsequently, by post-baking the insulating layer 5 formed by patterning for approximately one hour at the temperature of 280° C. to 300° C., the insulating layer 5 is baked and solidified. This vaporizes and dissolves part of organic elements in the insulating layer 5, thereby forming the insulating layer 5 whose film quality is enhanced.

Figure 4G:
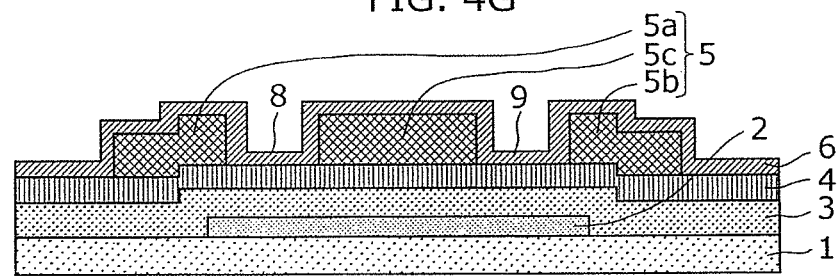
[FIG. 4G]

Next, as shown in FIG. 4G, the contact layer 6 is formed above the semiconductor layer 4 to cover the insulating layer 5. In this process, for instance, the contact layer 6 including amorphous silicon in which a pentad impurity such as phosphorous (P) is doped is formed by the plasma CVD.

Figure 4H:
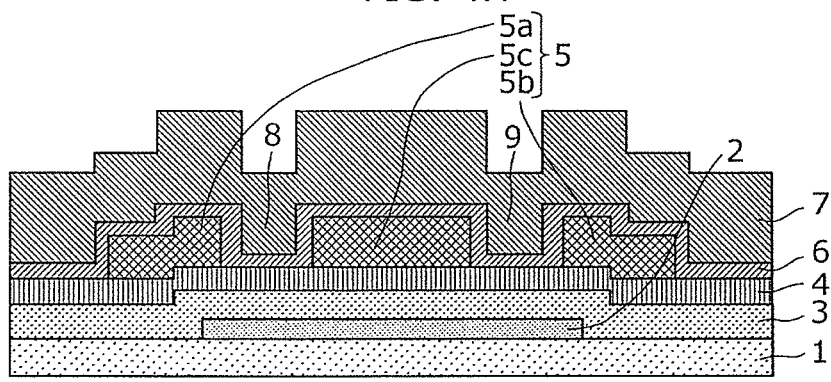
[FIG. 4H]
Figure 4I:
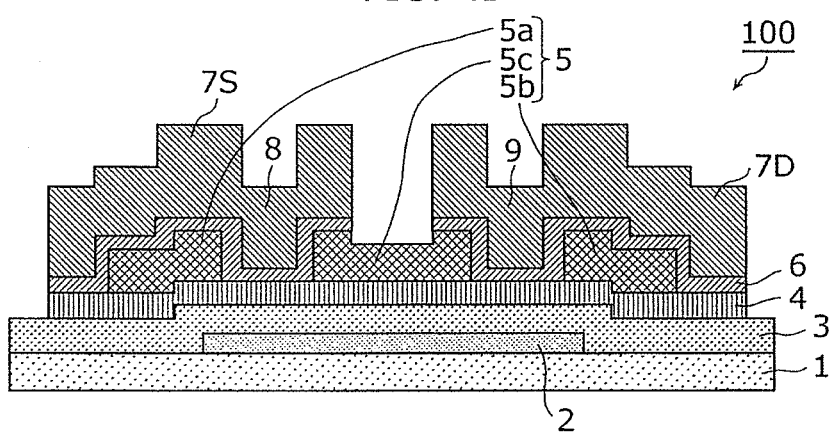
[FIG. 4I]

Next, as shown in FIG. 4H and FIG. 4I, the source electrode 7S and the drain electrode 7D are formed above the contact layer 6 by patterning (the seventh process). In the seventh process, as shown in FIG. 4H, a source-drain metal film 7 including the material of the source electrode 7S and the drain electrode 7D is first formed by sputtering, for example. Subsequently, to form the source electrode 7S and the drain electrode 7D each having a predetermined shape, a resist material is applied on the source-drain metal film 7, and exposure and development are performed to form a resist that is patterned in a predetermined shape. Then, the source electrode 7S and the drain electrode 7D each having the predetermined shape are formed as shown in FIG. 4I, by patterning the source-drain metal film 7 through wet etching using the resist as a mask. At this time, the contact layer 6 functions as an etching stopper layer. Subsequently, the resist on the source electrode 7S and the drain electrode 7D is removed. In the seventh process, the source electrode 7S is electrically connected to the channel region of the semiconductor layer 4 with the first contact opening 8 and one of the contact layers 6 therebetween, and the drain electrode 7D is electrically connected to the channel region of the semiconductor layer 4 with the second contact opening 9 and the other of the contact layers 6 therebetween.

Next, the contact layer 6 is patterned and the semiconductor layer 4 is also patterned into an island shape, by dry etching using the source electrode 7S and the drain electrode 7D as a mask. This makes it possible to form the pair of the contact layers 6 having a predetermined shape and the semiconductor layer 4 having the island shape. As a condition for the dry etching, it is possible to use chlorine gas. In addition, the contact layers 6 and the semiconductor layer 4 can be patterned by wet etching the source electrode 7S and the drain electrode 7D and then dry etching using the resist mask.

As described above, it is possible to manufacture the thin-film semiconductor device 100 according to Embodiment 1.

The following describes the function effect of the thin-film semiconductor device 100 according to this embodiment. As stated above, the first insulating layer region 5a is placed corresponding to one end of the gate electrode 2, that is, placed to cover from above the part of the semiconductor layer 4 corresponding to one of the step portions 10 of the gate insulating film 3. In addition, the second insulating layer region 5b is placed corresponding to the other end of the gate electrode 2, that is, placed to cover from above the part of the semiconductor layer 4 corresponding to the other of the step portions 10 of the gate insulating film 3. With these structures, the paths of leak current caused by tunnel current are blocked by the first insulating layer region 5a and the second insulating layer region 5b, and thus the parts of the semiconductor layer 4 where the electric fields concentrate, that is, the parts of the semiconductor layer 4 corresponding to the step portions 10 of the gate insulating film 3 do not contribute to the conduction of the leak current. For this reason, it is possible to reduce the possibility of the contribution of the generated tunnel current as the leak current. It is to be noted that it is also possible to reduce the possibility of the contribution of thermally generated current as the leak current.

Figure 5A:
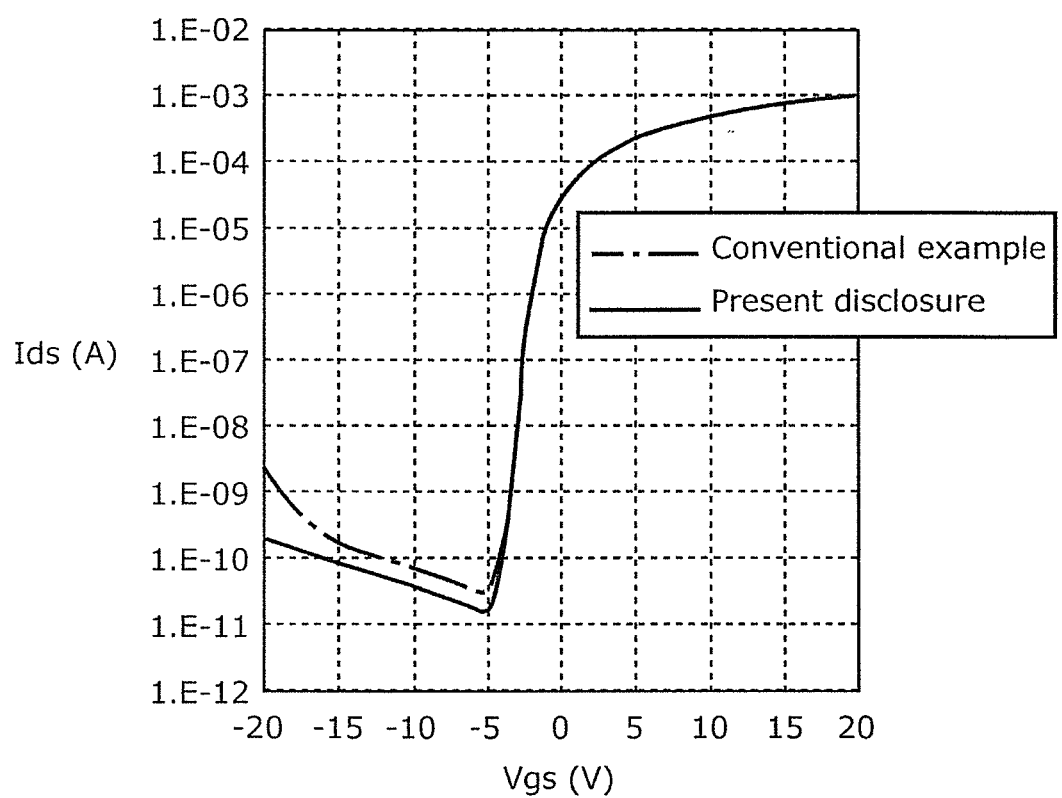
[FIG. 5A]
Figure 5B:
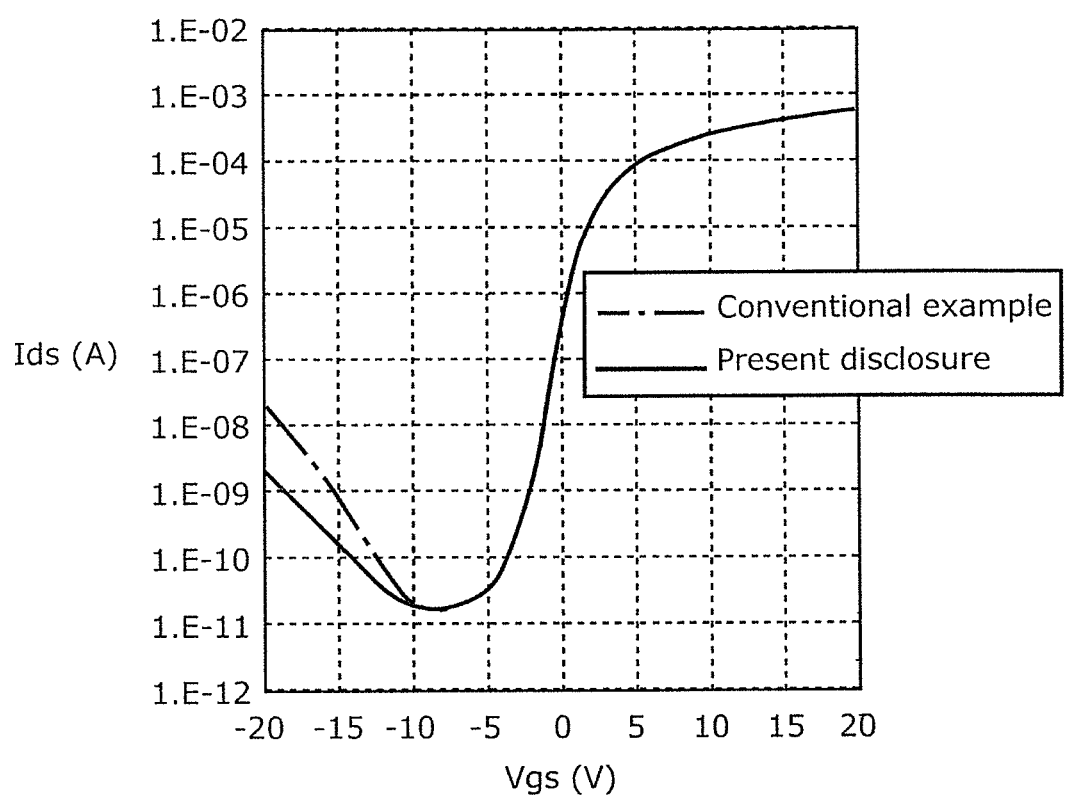
[FIG. 5B]

FIG. 5A is a graph showing a result of simulating each of electric characteristics of a thin-film semiconductor device according to Embodiment 1 and electric characteristics of a conventional thin-film semiconductor device. FIG. 5B is a graph showing a result of testing, using an actual device, each of the electric characteristics of the thin-film semiconductor device according to Embodiment 1 and the electric characteristics of the conventional thin-film semiconductor device. In FIG. 5A and FIG. 5B, the horizontal axis indicates the magnitude of gate-to-source voltage, and the vertical axis indicates the magnitude of drain current. In addition, in each of FIG. 5A and FIG. 5B, a solid line in the graph shows the corresponding result of the simulation or test using the thin-film semiconductor device 100 according to this embodiment, and an alternate long and short dash line in the graph shows the corresponding result of the simulation or test using the conventional thin-film semiconductor device 500 shown in FIG. 13.

As is clear from the results shown in FIG. 5A and FIG. 5B, a current value at a time of OFF operation (i.e., in a state where the gate-to-source voltage is negative) is reduced more in the thin-film semiconductor device 100 according to this embodiment than in the conventional thin-film semiconductor device. For this reason, it could be said that the thin-film semiconductor device 100 according to this embodiment produces a function effect of reducing the possibility of contribution of generated tunnel current as leak current at the time of the OFF operation.

Figure 6:
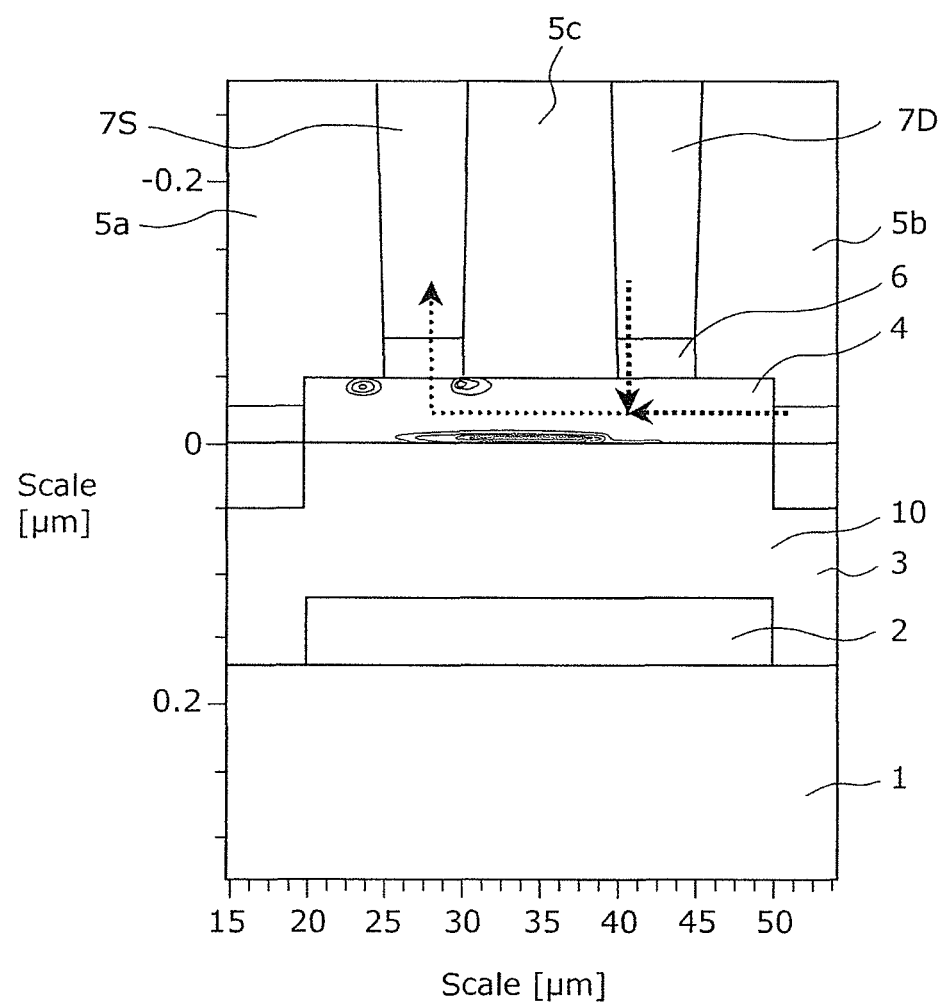
[FIG. 6]

FIG. 6 is a diagram showing a result of simulating current density distribution at a time of OFF operation in the thin-film semiconductor device 100 according to this embodiment. It is to be noted that in this simulation, the thin-film semiconductor device 100 having the structure shown in FIG. 1 is used in which molybdenum tungsten (MoW) having a film thickness of 50 nm, silicon oxide (SiO) having a film thickness of 120 nm, polycrystalline silicon having a film thickness of 50 nm, silicon oxide (SiO) having a film thickness of 500 nm, non-crystalline silicon having a film thickness of 40 nm, and aluminum (Al) having a film thickness of 600 nm are used as the gate electrode 2, the gate insulating film 3, the semiconductor layer 4, the insulating layer 5, the contact layer 6, and the source electrode 7S and the drain electrode 7D, respectively. In addition, −20 V and 5.1 V are applied as a gate-to-source voltage and a drain-to-source voltage, respectively. It is to be noted that in FIG. 6, contour lines represent density distribution of leak current generated at the time of the OFF operation.

As shown by the contour lines in FIG. 6, the distribution of the leak current flowing through the semiconductor layer 4 is significantly reduced in comparison to the result of the simulation shown in FIG. 15. For this reason, it could be said that the thin-film semiconductor device 100 according to this embodiment produces a function effect of blocking, with the first insulating layer region 5a and the second insulating layer region 5b, paths of the leak current indicated by dashed arrows in FIG. 6.

Figure 7A:
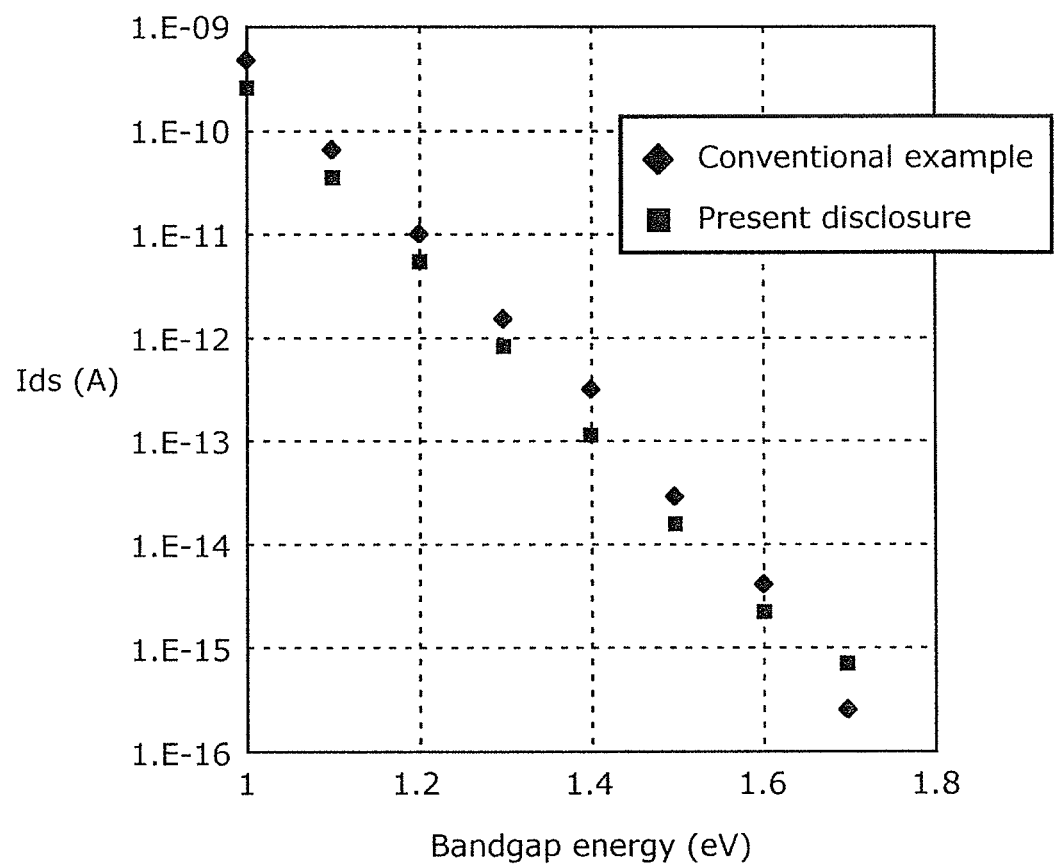
[FIG. 7A]

It is to be noted that the semiconductor layer 4 has a bandgap energy of 1.6 eV or less. FIG. 7A is a graph showing a result of simulating a variation in drain current relative to the bandgap energy of a semiconductor layer. In FIG. 7A, square marks indicate the result of the simulation using the thin-film semiconductor device 100 according to this embodiment, and rhombic marks indicate the result of the simulation using the conventional thin-film semiconductor device 500 shown in FIG. 13. In the simulation shown in FIG. 7A, calculated is the magnitude of drain current when the bandgap energy of the semiconductor layers 4 and 54 is changed from 1.0 eV to 1.7 eV in a state where −10 V and 5.1 V are applied as the gate-to-source voltage and the drain-to-source voltage, respectively. As is clear from the result shown in FIG. 7A, in a region where the bandgap energy is 1.6 eV or less, the drain current at the time of the OFF operation in the thin-film semiconductor device 100 according to this embodiment is less than the drain current at the time of the OFF operation in the conventional thin-film semiconductor device 500. Therefore, this embodiment makes it possible to effectively increase OFF characteristics by setting the bandgap energy of the semiconductor layer 4 to 1.6 eV or less.

Figure 7B:
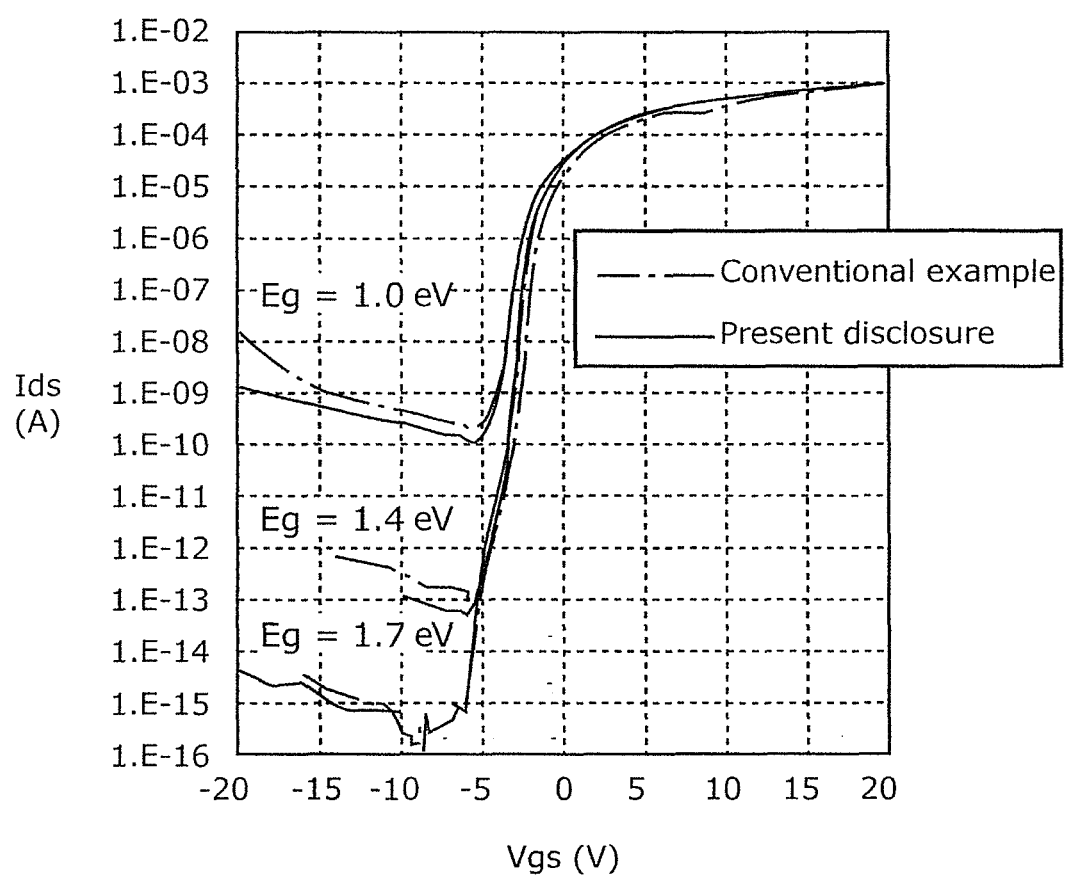
[FIG. 7B]

FIG. 7B is a graph showing a result of simulating a variation in drain current relative to gate-to-source voltage. In FIG. 7B, solid lines in the graph show the result of the simulation using the thin-film semiconductor device 100 according to this embodiment, and alternate long and short dash lines in the graph show the result of the simulation using the conventional thin-film semiconductor device 500 shown in FIG. 13. In the simulation shown in FIG. 7B, calculated are the electric characteristics (i.e., the variation in drain current relative to the gate-to-source voltage) when the bandgap energy (Eg) of the semiconductor layers 4 and 54 is changed to 1.0 eV, 1.4 eV, and 1.7 eV in a state where 5.1 V is applied as the drain-to-source voltage. As is clear from the result shown in FIG. 7B, when the bandgap energy is 1.4 eV or 1.6 eV, the drain current at the time of the OFF operation in the thin-film semiconductor device 100 according to this embodiment is less than the drain current at the time of the OFF operation in the conventional thin-film semiconductor device 500. Therefore, this embodiment makes it possible to effectively increase the OFF characteristics by setting the bandgap energy of the semiconductor layer 4 to 1.6 eV or less.

Figure 8A:
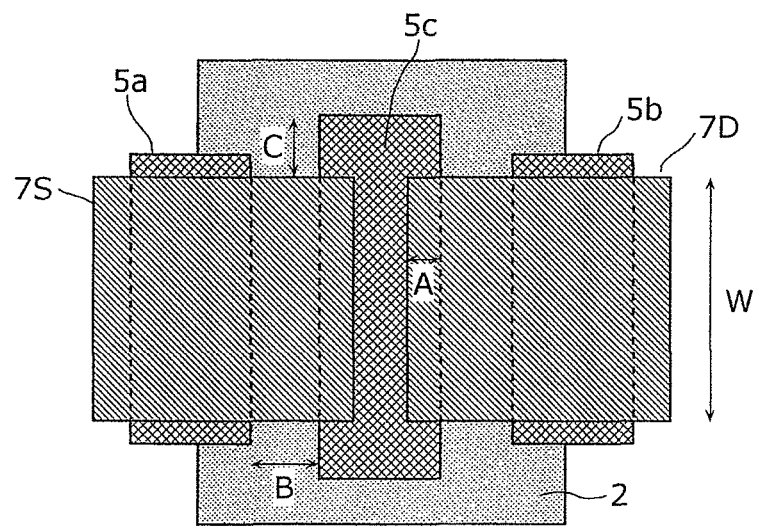
[FIG. 8A]
Figure 8B:
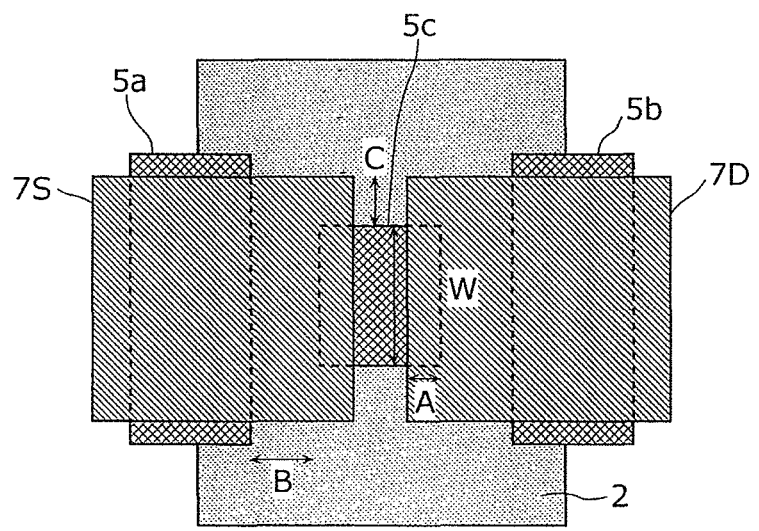
[FIG. 8B]

The following describes a relationship between the above-mentioned dimension C and parasitic resistance. Here, the parasitic resistance means resistance between the channel region of the semiconductor layer 4, and the source electrode 7S and the drain electrode 7D. Each of FIG. 8A and FIG. 8B is a plan view for describing the definitions of a dimension A, a dimension B, and the dimension C. It is to be noted that the dimension A and the dimension B will be described later. The sign of the dimension C in a state where, as shown in FIG. 8B, the source electrode 7S and the drain electrode 7D protrude from the third insulating layer region 5c in a channel width direction is defined as positive, and the sign of the dimension C in a state where, as shown in FIG. 8A, the source electrode 7S and the drain electrode 7D are held within the third insulating layer region 5c in the channel width direction is defined as negative. In addition, a width to be a bottleneck of a width of a current path is defined as a dimension W corresponding to a channel width. In other words, when the dimension C has the positive sign as shown in FIG. 8B, the size of the third insulating layer region 5c in the channel width direction is defined as the dimension W, and when the dimension C has the negative sign as shown in FIG. 8A, the size of the source electrode 7S and the drain electrode 7D in the channel width direction is defined as the dimension W.

Figure 9A:
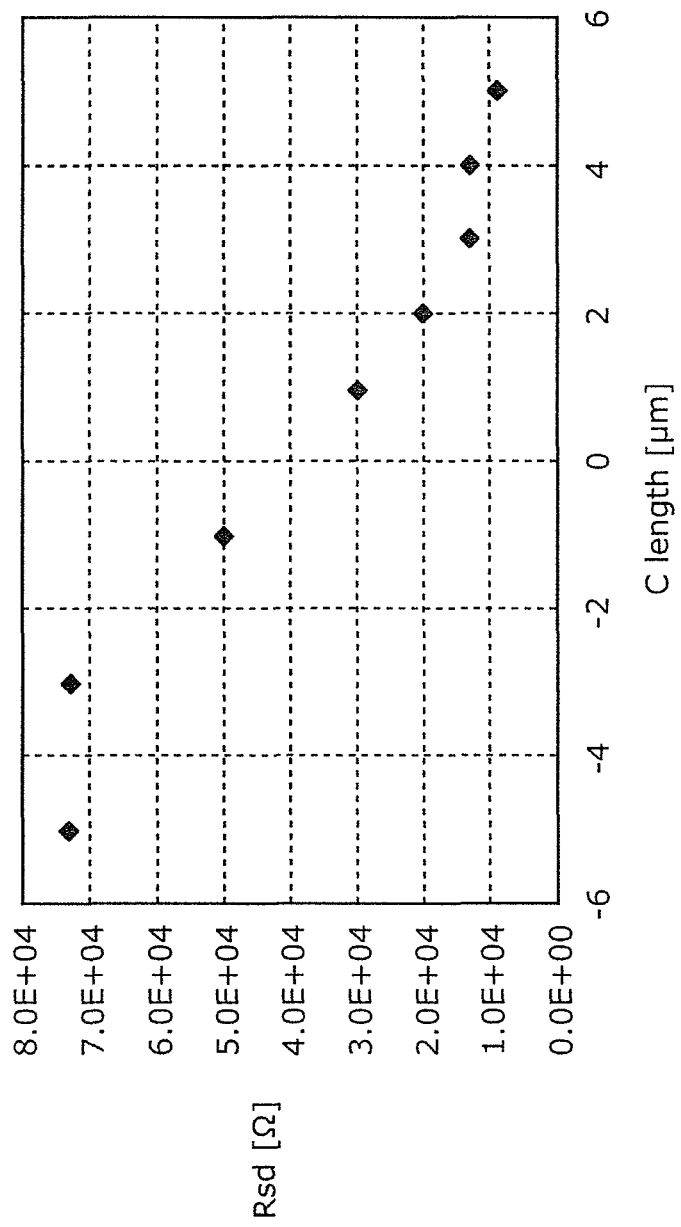
[FIG. 9A]
Figure 9B:
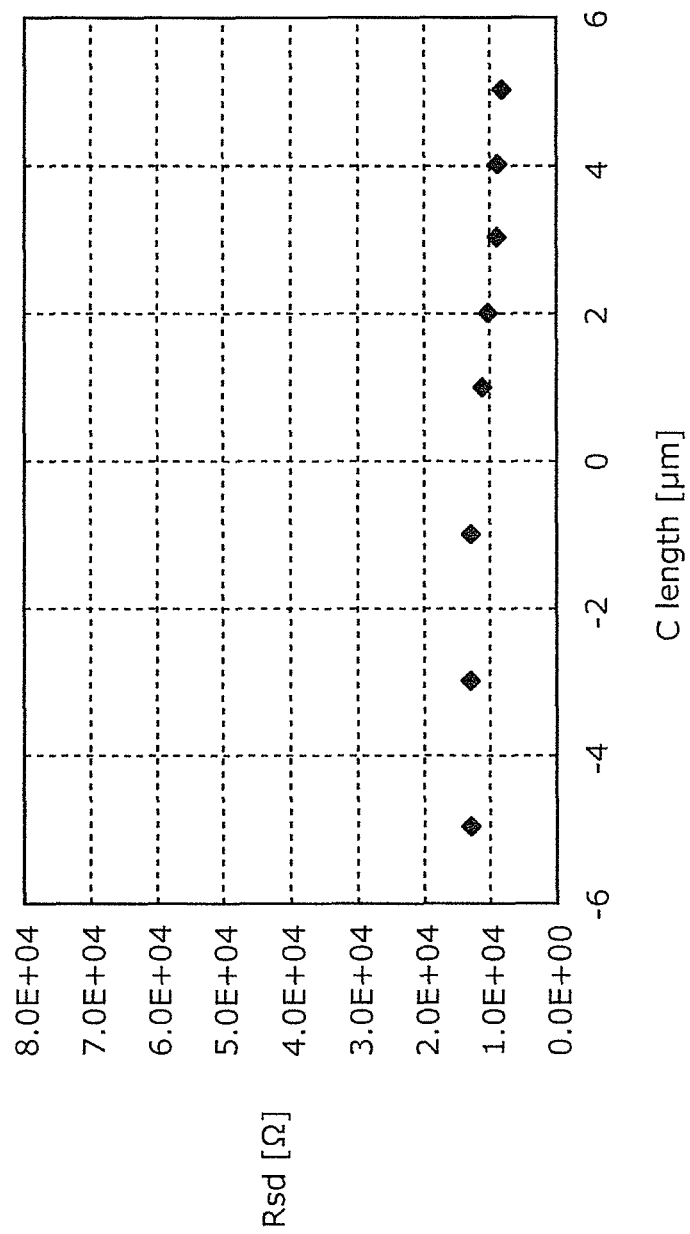
[FIG. 9B]
Figure 9C:
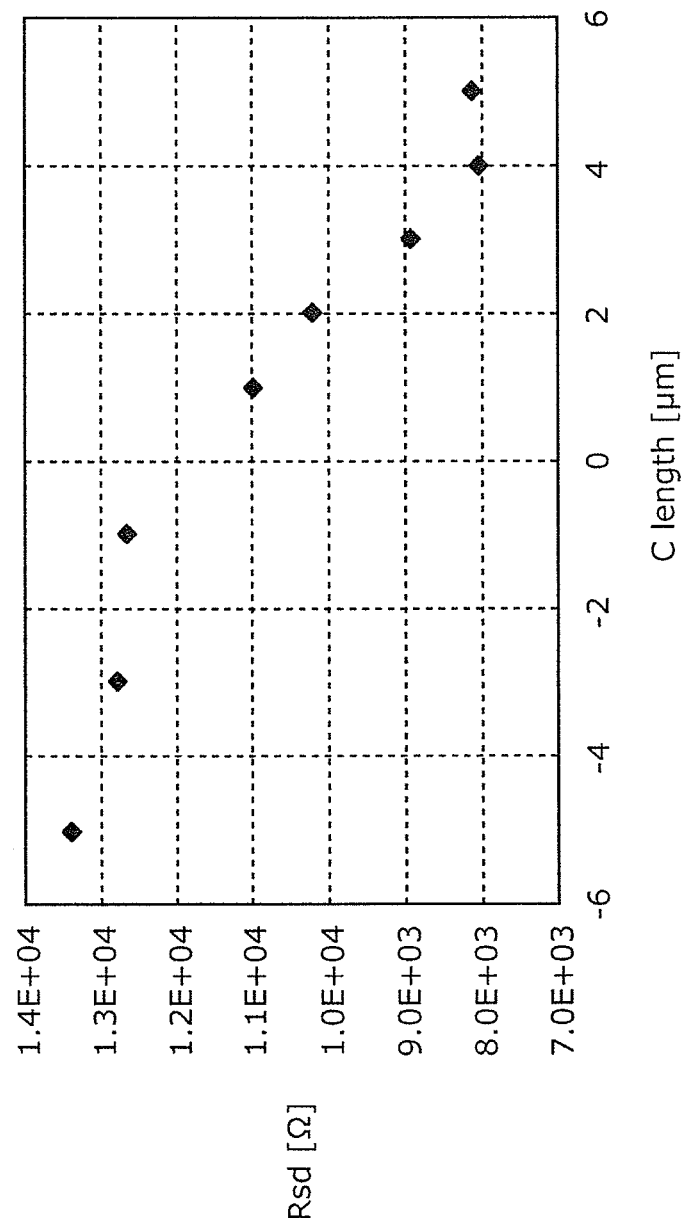
[FIG. 9C]

FIG. 9A is a graph showing an experimental result-obtained by evaluating a variation in parasitic resistance relative to the dimension C when the dimension W is 5 μm, the dimension A is 2 μm, the dimension B is 3 μm. FIG. 9B is a graph showing an experimental result obtained by evaluating a variation in parasitic resistance relative to the dimension C when the dimension W is 50 μm, the dimension A is 2 μm, the dimension B is 3 μm. FIG. 9C is a graph more clearly showing the variation in parasitic resistance by reducing a scale of the vertical axis in FIG. 9B. In FIG. 9A, FIG. 9B, and FIG. 9C, the horizontal axis indicates the size of the dimension C, and the vertical axis indicates the magnitude of the parasitic resistance (Rsd). As is clear from the results shown in FIG. 9A, FIG. 9B, and FIG. 9C, when the dimension C has the negative sign, the parasitic resistance is less in a planar structure in which the dimension W is 50 μm than in a planar structure in which the dimension W is 5 μm. To put it another way, it is clear that the parasitic resistance is present which is inversely proportional to a contact area S (roughly proportional to the dimension W) of a part where the source electrode 7S, the drain electrode 7D, and the semiconductor layer 4 are in contact with each other. In contrast, when the dimension C has the positive sign, the magnitudes of the parasitic resistance converge on a substantially same value in the cases where the dimension W is 5 μm and where the dimension W is 50 μm. Stated differently, it is clear that in this case, the parasitic resistance is present which has a certain value regardless of the size of the contact area S. In addition, regardless of the size of the dimension W, it is clearly possible to reduce the parasitic resistance in a region where the dimension C is 2 μm or more, and more effectively reduce the parasitic resistance in a region where the dimension C is 4 μm or more.

Figure 10A:
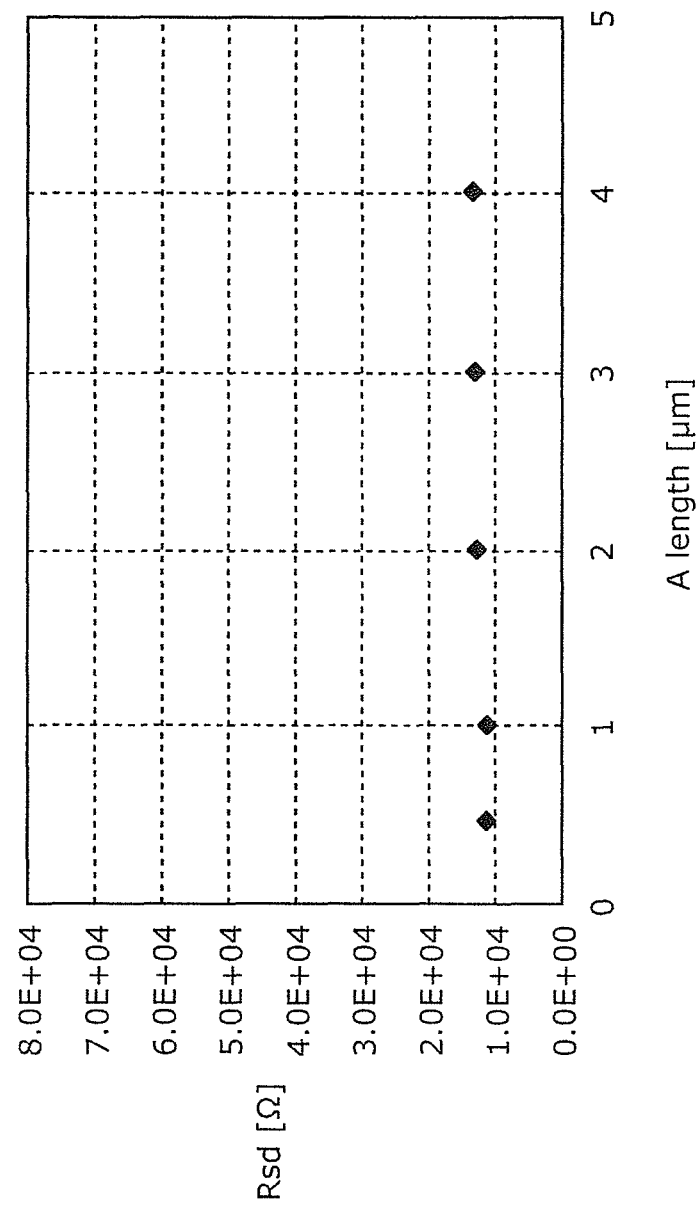
[FIG. 10A]
Figure 10B:
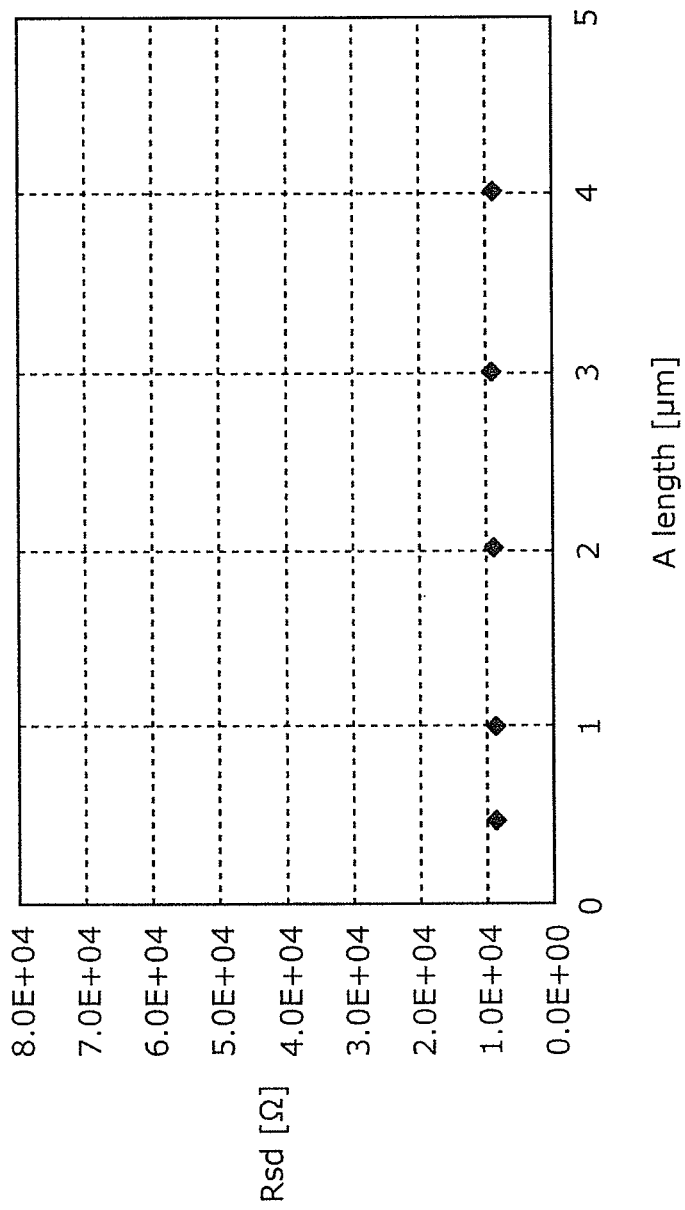
[FIG. 10B]

The following describes a relationship between the dimension A and parasitic resistance. As shown in FIG. 8A and FIG. 8B, the dimension A means an overlap width of the third insulating layer region 5c, the source electrode 7S, and the drain electrode 7D in a channel length direction (a horizontal direction in FIG. 8A and FIG. 8B). FIG. 10A is a graph showing an experimental result obtained by evaluating a variation in parasitic resistance relative to the dimension A when the dimension W is 5 μm, the dimension B is 3 μm, the dimension C is 3 μm. FIG. 10B is a graph showing an experimental result obtained by evaluating a variation in parasitic resistance relative to the dimension A when the dimension W is 50 μm, the dimension B is 3 μm, the dimension C is 3 μm. In FIG. 10A and FIG. 10B, the horizontal axis indicates the size of the dimension A, and the vertical axis indicates the magnitude of the parasitic resistance (Rsd). As is clear from the results shown in FIG. 10A and FIG. 10B, even when the size of the dimension A is increased, the magnitude of the parasitic resistance hardly varies. Therefore, it could be said that the size of the dimension A hardly affects the variation in the parasitic resistance. In addition, the magnitudes of the parasitic resistance converge on a substantially same value regardless of the size of the dimension A in the cases where the dimension W is 5 μm and where the dimension W is 50 μm. For this reason, it is clear that the size of the dimension W hardly affects the variation in the parasitic resistance.

The following describes a relationship between the dimension B and parasitic resistance. As shown in FIG. 8A and FIG.

Figure 11A:
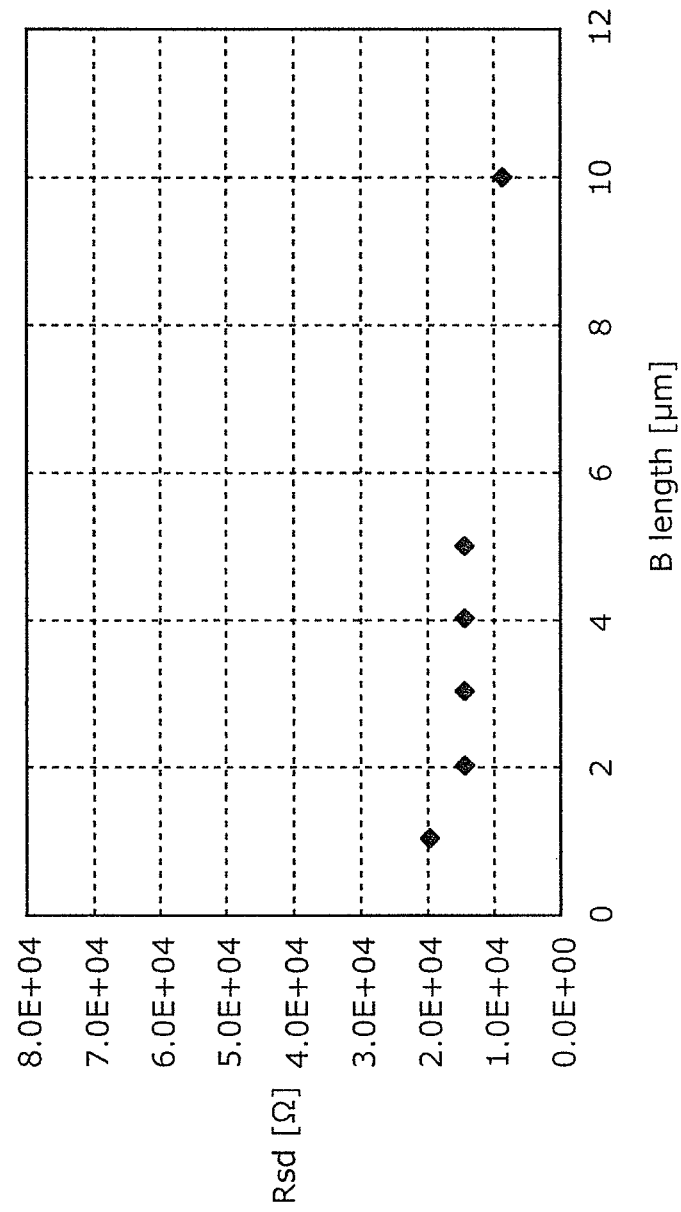
[FIG. 11A]
Figure 11B:
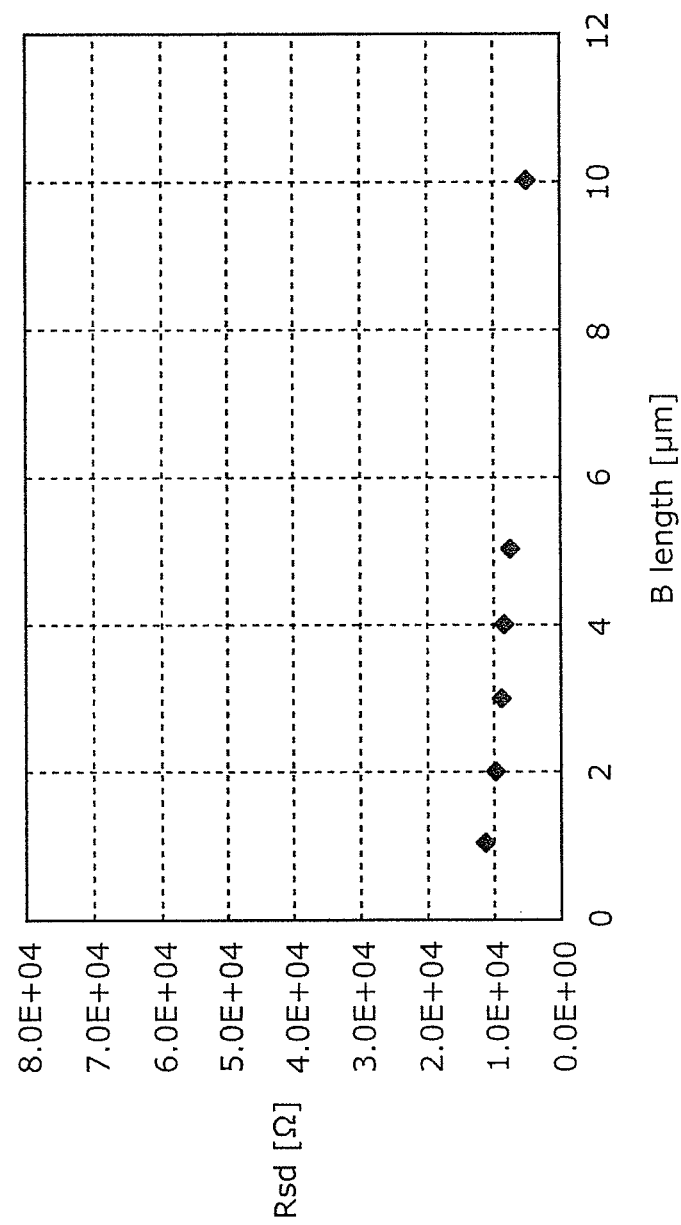
[FIG. 11B]

8B, the dimension B means an overlap width, in the channel length direction, of the gate electrode 2, the source electrode 7S, and the drain electrode 7D in a portion outside of the third insulating layer region 5c and a portion inside of the first insulating layer region 5a and the second insulating layer region 5b. FIG. 11A is a graph showing an experimental result obtained by evaluating a variation in parasitic resistance relative to the dimension B when the dimension W is 5 μm, the dimension A is 2 μm, the dimension C is 3 μm. FIG. 11B is a graph showing an experimental result obtained by evaluating a variation in parasitic resistance relative to the dimension B when the dimension W is 50 μm, the dimension A is 2 μm, the dimension C is 3 μm. In FIG. 11A and FIG. 11B, the horizontal axis indicates the size of the dimension B, and the vertical axis indicates the magnitude of the parasitic resistance (Rsd). As is clear from the results shown in FIG. 11A and FIG. 11B, although the parasitic resistance is likely to decrease since a contact area S simultaneously increases when the dimension B is increased, the magnitude of the parasitic resistance is limited to a slight reduction. Therefore, it could be said that in this case, the size of the dimension B hardly affects the variation in the parasitic resistance. In addition, the magnitudes of the parasitic resistance converge on a substantially same value regardless of the size of the dimension B in the cases where the dimension W is 5 μm and where the dimension W is 50 μm. For this reason, it could be said that the size of the dimension W hardly affects the variation in the parasitic resistance.

The following summarizes the above experimental results. It has been found that the parasitic resistance clearly has the dependence on the dimension C that varies the magnitude relationship between the source electrode 7S and the drain electrode 7D, and the third insulating layer region 5c in the channel width direction. It is to be noted that the change of the sign of the dimension C from the negative to the positive means the change of the planar structure from the structure shown in FIG. 8A to the structure shown in FIG. 8B. When the dimension C has the positive sign, the parasitic resistance varies slightly relative to the dimension W, the dimension A, and the dimension B that vary the contact area S. In contrast, when the dimension C has the negative sign, it has been found that the parasitic resistance has the dependence that is inversely proportional to the contact area S (substantially proportional to the dimension W). In terms of the dependence of the parasitic resistance on the dimension W, the dimension A, the dimension B, and the dimension C, the magnitude of the parasitic resistance varies not only depending on the size of the contact area S but also depending on whether or not, as shown in FIG. 8A and FIG. 8B, the source electrode 7S and the drain electrode 7D cover the four corners of the third insulating layer region 5c having a quadrangular planar structure.

Figure 11C:
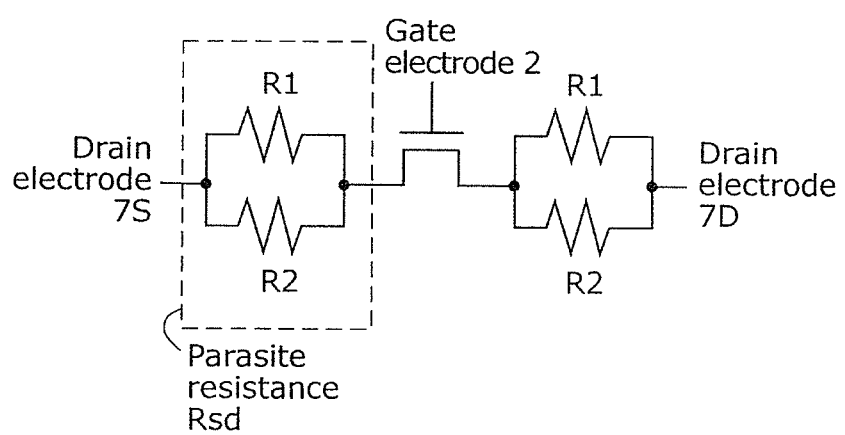
[FIG. 11C]

The above consideration leads to the model of the parasitic resistance Rsd shown in FIG. 11C. In other words, the parasitic resistance Rsd includes a parasitic resistance component R1 and a parasitic resistance component R2 in parallel, the parasitic resistance component R1 being inversely proportional to the contact area S (substantially proportional to W), and the parasitic resistance component R2 being a certain value resulting from the corners of the third insulating layer region 5c. In the planar structure where the dimension C has the negative sign as shown in FIG. 8A, the source electrode 7S and the drain electrode 7D do not cover the four corners of the third insulating layer region 5c having the quadrangular planar structure, and thus the parasitic resistance Rsd includes only the parasitic resistance component R1 that is inversely proportional to the contact area S (substantially proportional to W). In contrast, in the planar structure where the dimension C has the positive sign as shown in FIG. 8B, the source electrode 7S and the drain electrode 7D cover the corners of the third insulating layer region 5c, and thus the parasitic resistance Rsd includes the parasitic resistance component R1 and the parasitic resistance component R2. Here, the parasitic resistance component R2 is smaller than the parasitic resistance component R1, and thus the parasitic resistance Rsd is limited by the parasitic resistance component R2 resulting from the corners of the third insulating layer region 5c. For this reason, even when the dimension W, the dimension A, the dimension B, and the dimension C vary, the parasitic resistance Rsd hardly varies.

From the above, it is clear that to reduce the parasitic resistance Rsd, it is desirable to have the planar structure in which the parasitic resistance Rsd can be limited by the parasitic resistance component R2 and the dimension C has the positive sign. As a result, it is possible to reduce the parasitic resistance in the region where the dimension C is 2 μm or more, and more effectively reduce the parasitic resistance in the region where the dimension C is 4 μm or more.

(Embodiment 2)

Figure 12A:
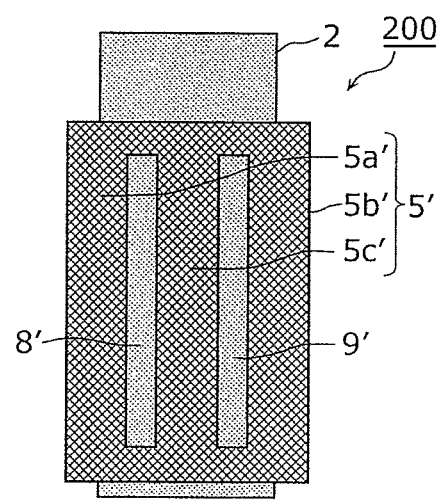
[FIG. 12A]
Figure 12B:
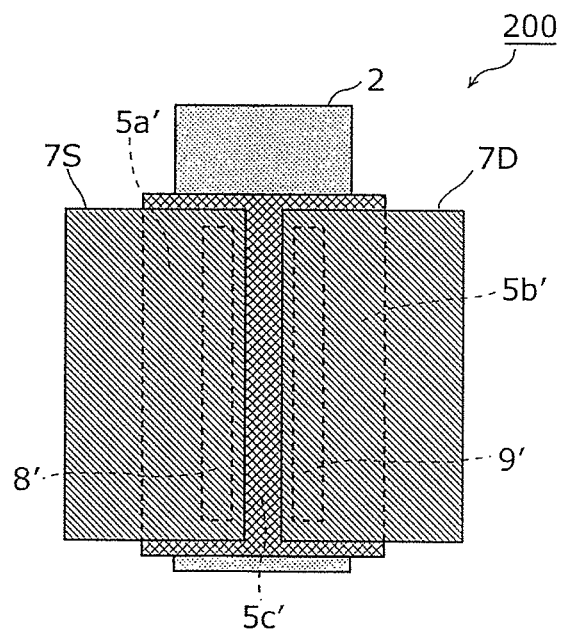
[FIG. 12B]

FIG. 12A is a plan view showing an arrangement relationship between a gate electrode and an insulating layer in a thin-film semiconductor device according to Embodiment 2. FIG. 12B is a plan view showing an arrangement relationship among a gate electrode, an insulating layer, a source electrode, and a drain electrode in the thin-film semiconductor device according to Embodiment 2.

As shown in FIG. 12A and FIG. 12B, an insulating layer 5' is integrally formed in a thin-film semiconductor device 200 according to this embodiment. In other words, a first insulating layer region 5a', a second insulating layer region 5b', and a third insulating layer region 5c' are connected to each other at their both ends in a channel width direction. The first insulating layer region 5a' is placed above one end of a gate electrode 2 and outside of a first contact opening 8' in a channel length direction. The second insulating layer region 5b' is placed above the other end of the gate electrode 2 and outside of a second contact opening 9' in the channel length direction. The third insulating layer region 5c' is placed above the center of the gate electrode 2 and between the first contact opening 8' and the second contact opening 9'.

Even with such a structure according to this embodiment, it is possible to produce the same function effect as Embodiment 1.

Although the thin-film semiconductor device and the method of manufacturing the same according to one or more aspects have been described based on the embodiments, the present disclosure is not limited to the embodiments. Those skilled in the art will readily appreciate that many modifications are possible in the exemplary embodiments without materially departing from the novel teachings and advantages of the present disclosure. Accordingly, all such modifications are intended to be included within the scope of the one or more aspects.

INDUSTRIAL APPLICABILITY

A thin-film semiconductor device in the present disclosure can be widely used for display devices of television sets, personal computers, mobile phones, and so on, or for various electrical appliances including other thin-film semiconductor devices.

The invention claimed is:

1. A thin-film semiconductor device comprising:
a substrate;
a gate electrode formed above the substrate;
a gate insulating film formed above the gate electrode and above the substrate extending beyond both ends of the gate electrode in a channel length direction, the gate insulating film including a flat portion disposed over the gate electrode and a step portion which is formed in each of parts of the gate insulating film corresponding to respective both ends of the gate electrode;
a semiconductor layer formed above the gate insulating film, and having a channel region and a bandgap energy of 1.6 eV or less;
an insulating layer formed above the semiconductor layer, having a first contact opening and a second contact opening that are placed apart from each other, and including a first insulating layer region, a second insulating layer region, and a third insulating layer region that is rectangular, the first insulating layer region being placed outside of the first contact opening in the channel length direction and above one end of the gate electrode, the second insulating layer region being placed outside of the second contact opening in the channel length direction and above the other end of the gate electrode which opposes the one end, and the third insulating layer region being placed between the first contact opening and the second contact opening; and
a source electrode and a drain electrode both formed above the insulating layer, the source electrode being electrically connected to the channel region with the first contact opening therebetween, and the drain electrode opposing the source electrode and being electrically connected to the channel region with the second contact opening therebetween,
wherein each of the source electrode and the drain electrode has a size in a channel width direction greater than a size of the third insulating layer region in the channel width direction, and the third insulating layer region has corners each of which is below a corresponding one of the source electrode and the drain electrode, the channel width direction being orthogonal to the channel length direction, and
the gate insulating film at the step portion has a film thickness less than a film thickness of the gate insulating film at the flat portion.

2. The thin-film semiconductor device according to claim 1,
wherein the third insulating layer region serves as a channel etching stopper layer that covers the channel region.

3. The thin-film semiconductor device according to claim 1,
wherein each end of the source electrode and the drain electrode protrudes 2 μm or more from both ends of the third insulating layer region in the channel width direction.

4. The thin-film semiconductor device according to claim 1,
wherein each end of the source electrode and the drain electrode protrudes 4 μm or more from both ends of the third insulating layer region in the channel width direction.

5. A thin-film semiconductor device comprising:
a substrate;
a gate electrode formed above the substrate;
a gate insulating film formed above the gate electrode and above the substrate extending beyond both ends of the gate electrode in a channel length direction;
a semiconductor layer formed above the gate insulating film, and having a channel region and a bandgap energy of 1.6 eV or less;
an insulating layer formed above the semiconductor layer, having a first contact opening and a second contact opening that are placed apart from each other, and including a first insulating layer region, a second insulating layer region, and a third insulating layer region that is rectangular, the first insulating layer region being placed outside of the first contact opening in the channel length direction and above one end of the gate electrode, the second insulating layer region being placed outside of the second contact opening in the channel length direction and above the other end of the gate electrode which opposes the one end, and the third insulating layer region being placed between the first contact opening and the second contact opening; and
a source electrode and a drain electrode both formed above the insulating layer, the source electrode being electrically connected to the channel region with the first contact opening therebetween, and the drain electrode opposing the source electrode and being electrically connected to the channel region with the second contact opening therebetween,
wherein each of the source electrode and the drain electrode has a size in a channel width direction greater than a size of the third insulating layer region in the channel width direction, and the third insulating layer region has corners each of which is below a corresponding one of the source electrode and the drain electrode, the channel width direction being orthogonal to the channel length direction.

* * * * *

UNITED STATES PATENT AND TRADEMARK OFFICE
CERTIFICATE OF CORRECTION

PATENT NO. : 9,166,056 B2
APPLICATION NO. : 13/940643
DATED : October 20, 2015
INVENTOR(S) : Hiroshi Hayashi et al.

Page 1 of 1

It is certified that error appears in the above-identified patent and that said Letters Patent is hereby corrected as shown below:

On the Title Page, at Item (73) Assignee, of the printed patent, "PANASONIC CORPORATION, Osaka (JP); PANASONIC LIQUID DISPLAY CO., LTD., Hyogo (JP)" should read --PANASONIC CORPORATION, Osaka (JP); PANASONIC LIQUID CRYSTAL DISPLAY CO., LTD., Hyogo (JP)--.

Signed and Sealed this
Twenty-second Day of March, 2016

Michelle K. Lee
*Director of the United States Patent and Trademark Office*